US006852766B1

(12) United States Patent
DeVoe

(10) Patent No.: US 6,852,766 B1
(45) Date of Patent: Feb. 8, 2005

(54) MULTIPHOTON PHOTOSENSITIZATION SYSTEM

(75) Inventor: Robert J. DeVoe, Oakdale, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 51 days.

(21) Appl. No.: 10/311,041

(22) PCT Filed: Jun. 14, 2001

(86) PCT No.: PCT/US01/19164

§ 371 (c)(1),
(2), (4) Date: Dec. 12, 2002

(87) PCT Pub. No.: WO01/96409

PCT Pub. Date: Dec. 20, 2001

Related U.S. Application Data

(60) Provisional application No. 60/211,703, filed on Jun. 15, 2000.

(51) Int. Cl.$^7$ ............................. C08F 2/50; G03F 7/029
(52) U.S. Cl. ............................. 522/25; 522/26; 522/28; 522/7; 522/170; 522/182; 430/270.1; 430/280.1; 430/281.1
(58) Field of Search ................................ 522/7, 25, 26, 522/28, 170, 182; 430/270.1, 280.1, 281.1

(56) References Cited

U.S. PATENT DOCUMENTS

| | | |
|---|---|---|
| 3,018,262 A | 1/1962 | Schroeder |
| 3,117,099 A | 1/1964 | Proops et al. |
| 3,729,313 A | 4/1973 | Smith |
| 3,741,769 A | 6/1973 | Smith |
| 3,758,186 A | 9/1973 | Brumm |
| 3,779,778 A | 12/1973 | Smith et al. |
| 3,808,006 A | 4/1974 | Smith |
| 3,954,475 A | 5/1976 | Bonham et al. |
| 3,987,037 A | 10/1976 | Bonham et al. |
| 4,041,476 A | 8/1977 | Swainson |
| 4,078,229 A | 3/1978 | Swanson et al. |
| 4,228,861 A | 10/1980 | Hart |
| 4,238,840 A | 12/1980 | Swainson |
| 4,250,053 A | 2/1981 | Smith |
| 4,279,717 A | 7/1981 | Eckberg et al. |
| 4,288,861 A | 9/1981 | Swainson et al. |
| 4,333,165 A | 6/1982 | Swainson et al. |
| 4,394,403 A | 7/1983 | Smith |
| 4,394,433 A | 7/1983 | Gatzke |
| 4,466,080 A | 8/1984 | Swainson et al. |
| 4,471,470 A | 9/1984 | Swainson et al. |
| 4,491,628 A | 1/1985 | Ito et al. |
| 4,547,037 A | 10/1985 | Case |
| 4,588,664 A | 5/1986 | Fielding et al. |
| 4,642,126 A | 2/1987 | Zador et al. |
| 4,652,274 A | 3/1987 | Boettcher et al. |
| 4,666,236 A | 5/1987 | Mikami et al. |
| 4,775,754 A | 10/1988 | Vogel et al. |
| 4,859,572 A | 8/1989 | Farid et al. |
| 4,963,471 A | 10/1990 | Trout et al. |
| 5,006,746 A | 4/1991 | Kasuga et al. |
| 5,034,613 A | 7/1991 | Denk et al. |
| 5,037,917 A | 8/1991 | Babb et al. |
| 5,145,942 A | 9/1992 | Hergenrother et al. |
| 5,159,037 A | 10/1992 | Clement et al. |
| 5,159,038 A | 10/1992 | Babb et al. |
| 5,225,918 A | 7/1993 | Taniguchi et al. |
| 5,235,015 A | 8/1993 | Ali et al. |
| 5,422,753 A | 6/1995 | Harris |
| 5,446,172 A | 8/1995 | Crivello et al. |
| 5,478,869 A | 12/1995 | Takahashi et al. |
| 5,545,676 A * | 8/1996 | Palazzotto et al. ............ 522/15 |
| 5,665,522 A | 9/1997 | Vogel et al. |
| 5,703,140 A * | 12/1997 | Kunita et al. .................. 522/57 |
| 5,747,550 A | 5/1998 | Nohr et al. |
| 5,750,641 A | 5/1998 | Ezzell et al. |
| 5,753,346 A | 5/1998 | Leir et al. |
| 5,759,721 A | 6/1998 | Dhal et al. |
| 5,770,737 A | 6/1998 | Reinhardt et al. |
| 5,847,812 A | 12/1998 | Ooki et al. |
| 5,854,868 A | 12/1998 | Yoshimura et al. |
| 5,856,373 A | 1/1999 | Kaisaki et al. |
| 5,859,251 A | 1/1999 | Reinhardt et al. |
| 5,864,412 A | 1/1999 | Wilde |
| 5,952,152 A * | 9/1999 | Cunningham et al. ... 430/281.1 |
| 5,998,495 A * | 12/1999 | Oxman et al. ................ 522/15 |
| 6,005,137 A | 12/1999 | Moore et al. |
| 6,025,406 A | 2/2000 | Oxman et al. |
| 6,025,938 A | 2/2000 | Kathman et al. |
| 6,048,911 A | 4/2000 | Shustack et al. |
| 6,051,366 A * | 4/2000 | Baumann et al. ........ 430/281.1 |
| 6,100,405 A | 8/2000 | Reinhardt et al. |
| 6,103,454 A | 8/2000 | Dhar et al. |
| 6,215,095 B1 | 4/2001 | Partanen et al. |
| 6,267,913 B1 | 7/2001 | Marder et al. |
| 6,322,931 B1 * | 11/2001 | Cumpston et al. ............. 430/1 |
| 6,541,591 B2 | 4/2003 | Olson et al. |

FOREIGN PATENT DOCUMENTS

| | | |
|---|---|---|
| DE | 41 42 327 | 6/1993 |
| DE | 42 19 376 | 12/1993 |
| WO | WO 92/00185 | 1/1992 |
| WO | WO 98/21521 | 5/1998 |
| WO | WO 99/23650 | 5/1999 |
| WO | WO 99/53242 | 10/1999 |
| WO | WO 99/54784 | 10/1999 |
| WO | WO 02/079691 | 10/2002 |

OTHER PUBLICATIONS

R. D. Allen, G. M. Wallraff, W. D. Hinsberg, and L. L. Simpson in *High Performance Acrylic Polymers for Chemically Amplified Photoresist Applications*, J. Vac. Sci. Technol. B, 9, 3357 (1991).

(List continued on next page.)

Primary Examiner—Susan Berman
(74) Attorney, Agent, or Firm—Lucy C. Weiss

(57) ABSTRACT

A method of multiphoton photosensitizing a photoreactive composition comprises irradiating the composition with light sufficient to cause simultaneous absorption of at least two photons, thereby inducing at least one acid- or radical-initiated chemical reaction where the composition is exposed to the light. The composition comprises: (a) at least one reactive species that is capable of undergoing such reaction; and (b) at least one multi-component, multiphoton photoinitiator system.

35 Claims, 1 Drawing Sheet

OTHER PUBLICATIONS

C. Xu and W. W. Webb in *J. Opt. Soc. Am. B*, 13, 481 (1996).

R. D Allen et al. in *Proc. SPIE* 2438, 474 (1995).

I. B. Berlman in *Handbook of Fluorescence Spectra of Aromatic Molecules*, Second Edition, pp. 24–27, Academic Press, New York (1971).

J. N. Demas and G. A. Crosby in *J. Phys. Chem.* 75, 991–1024 (1971).

J. V. Morris, M. A. Mahoney, and J. R. Huber in *J. Phys. Chem. 80*, 969–974 (1976).

*Bull. Chem. Soc.* Japan, 42, 2924–2930 (1969).

R. J. Cox, *Photographic Sensitivity*, Academic Press (1973), R.J. Cox, ed., pp. 241–263.

D. F. Eaton in *Advances in Photochemistry*, B. Voman et al., vol. 13, pp. 427–488, (1986).

Beringer et al., *J. Am. Chem. Soc. 81*, 342 (1959).

Makukha et al., *Two–Photon–Excitation Spatial Distribution for Cross Focused Gaussian Beams, Applied Optics*, vol. 40, No. 23, pp. 3932–3936 (Aug. 10, 2001).

Bunning et al. *Electronically Switchable Grating Formed Using Ultrafast Holographic Two–Photon–Induced Photopolymerization, Chem. Mater.*, 2000, 12 pp. 2842–2844.

Diamond et al., *Two–Photon Holography in 3–D Photopolymer Host–Guest Matrix, Optics Express*, vol. 6, No. 3, Jan. 31, 2000, pp. 64–68.

Diamond et al., *Two–Photon Holography in 3–D Photopolymer Host–Guest Matrix: errata ,Optic Express*, vol. 6, No. 4, Feb. 14, 2000, pp. 109–110.

Ashley et al., *Holographic Data Storage, IBM J. Res. Develop.* vol. 44, No. 3, May 2000, pp. 341–368.

Belfield et al., *Near–IR Two–Photon Photoinitiated Polymerization Using a Fluorone/Amine Initiating System, J. Am. Chem. Soc.*, 2000, 122 pp. 1217–1218.

Campagnola et al., *3–Dimensional Submicron Polymcrization of Acrylamide By Multiphoton Excitation of Xanthene Dyes, Macromolecules*, 2000, vol. 33, pp. 1511–1513.

Hong–Bo Sun et al., *Three–dimensional Photonic Crystal Structures Achieved With Two–Photon–Absorption Photopolymerization of Material, Applied Physics Letters*, vol. 74, No. 6, Feb. 8, 1999, pp. 786–788.

Cumpston et. al. *Two–Photon Polymerization Intiators For Three–Dimensional Optical Data Storage and Microfabrication, Nature*, vol. 398, Mar. 4, 1999, pp. 51–54.

Joshi et al., *Three–dimensional Optical Circuitry Using Two–Photo–Assisted Polymerization, Applied Physics Letters*, vol. 74, No. 2, Jan. 11, 1999, pp. 170–172.

Bunning et al., *Electrically Switchable Grating Formed Using Ultrafast Holographic Two–Photon–Induced Photopolymerization, Chem. Mater*, 2000, vol. 12, pp. 2842–2844.

Kirkpatrick et al. *Holographic Recording Using Two–Photon–Induced Photopolymerization, Appl. Phys. A*, vol. 69, pp. 461–464, 1999.

Maruo s et al., *Movable Microstructures made by Two–Photon Three–Dimensional Microfabrication*, 1999 *International Symposium on Micromechatronics and Human Science*, vol. 23, pp. 173–178 XP002191032.

Kuebler S M et al., *Three–Dimensional Microfabrication Using Two–Photon Activated Chemistry, SPIE*, vol. 3937, pp. 97–105, Jan. 27, 2000 XP008000209.

Cumpston B H et al., *New Photopolmers Based on Two–Photon Absorbing Chromophores and Application to Three–Dimensional Microfabrication and Optical Storage, Mat. Res. Soc. Symp. Proc.*, vol. 488, pp. 217–225, 1998, XP008000191.

Kawata S. et al., *Photon–Iduces Micro/Nano Fabrication, Manipulation and Imaging with Unconvential Photo–Active Systems, Mol. Cryst. Liq. Cryst.*, vol. 314, pp. 173–178, Aug. 25, 1997, XP001059839.

Tanaka et al., *Three–Dimensional Fabrication and Observation of Micro–Structures Using Two–Photon Absorption and Fluorescence, SPIE*, vol. 3937, pp. 92–96, Jan. 27, 2000, XP001051866.

Wenseleers et al., *Five Orders–of–Magnitude Enhancement of Two–Photon Absorption for Dyes On Silver Nanoparticle Fractal Clusters, J. Phys. Chem. B*, vol. 106, pp. 6853–6863, 2002.

Zhou et al., *Efficient Photacids Based Upon Triarylamine Dialkylsulfonium Salts, J. Am. Chem. Soc.*, vol. 124, No. 9, pp. 1897–1901.

Zhou et al., *An Efficient Two–Photon–Generated Photoacid Applied To Positive–Tone 3D Microfabrication, Science*, vol. 296, pp. 1106–1109, May 10, 2002.

Stellacci et al., *Laser and Electon–Beam Induced Growth of Nanoparticles for 2D and 3D Metal Patterning, Adv. Mater.*, vol. 14, No. 3, pp. 194–198, Feb. 2002.

Watanabe et al., *Photoreponsive Hydrogel Microstructure Fabricated by Two–Photon Initiated Polymerization, Adv. Func. Mater.*, vol. 12, No. 9, pp. 611–614, Sep. 2002.

Hong–Bo Sun, *Real Three–Dimensional Microstructures Fabricated By Photpolymerization of Resins Through Two–Photon Absorption, Optical Letters*, vol. 25, No. 5, pp. 1110–1112, Aug. 2000.

Misawa et al., *Microfabrication By Femtosecond Laser Irradiation, SPIE.*, vol. 3933, pp. 246–260, 2000.

Miwa, *Femtosecond Two–Photon Stereo–Lithography, Applied Physics A*, vol. 73, No. 5, pp. 561–566, 2001.

Kawata et al., *Two–Photon Photopolymerization of Functional Micro–Devices, Journal of Photopolymer Science and Technology*, vol. 15, No. 3, pp. 471–474, 2002.

Boiko et al., *Thresold Enhancement in Two–Photon Photopolymerization, SPIE*, vol. 4097, pp. 254–263, 2000.

Belfield et al., *Multiphoton–Absorbing Organic Materials For Microfabrication*, emerging Optical Applications and Non–Destructive Three–Dimensional Imaging, *J. Phys. Org.*, vol. 13, pp. 837–849, 2000.

Serbin et al., *Femtosecond Laser–Induced Two–Photon Polymerization of Inorganic–Organic Hybrid Materials for Applications in Photonics, Optics Letters*, vol. 28, No. 5, pp. 301–303, Mar. 2003.

Davidson, *The Chemistry of Photoinitiators Some Recent Developments, J. Photochem. Photobiol. A.*, vol. 73, pp. 81–96, 1993.

Dektar et al., *Photochemistry of Triarylsulfonium Salts, J. Am. Chem. Soc.*, vol. 112, pp. 6004–6015, 1990.

Denk et al., *Two–Photon Laser Scanning Fluorescence Microscopy, Science*, vol. 248, pp. 73–76, Apr. 1990.

Dvornikov et al., *Two–Photon Three–Dimensional Optical Storage Memory, Advances in Chemistry Series*, vol. 240, pp. 161–177, 1994.

Ito, *Chemical Amplification Resists: History and Development Within IBM, IBM J. Res. Develop.*, vol. 41, No. ½, pp. 69–80, Mar. 1997.

Jenkins et al., *Fundamentals of Optics*, 3rd Edition, McGraw–Hill, New York, pp. 331, 1957.

Kavarnos et al., *Photosensitization by Reversible Electron Transfer: Theories, Experimental Evidence, and Examples, Chem. Rev.*, vol. 86, pp. 401–449, Apr. 1986.

Kennedy et al., *p–Bis(o–methylstyryl) benzene as a Power–Squared Sensor for Two–Photon Absorption Measurements between 537 and 694 nm*, Anal. Chem., vol. 58, pp. 2643–2647, 1986.

Kewitsch et al., *Self–Focusing and Self–Trapping of Optical Beams Upon Photopolymerization*, Optics Letters, vol. 21, No. 1, pp. 24–26, Jan. 1996.

Lee et al., Micromachining Applications of a High Resolution Ultrathick Photoresist, *J. Vac. Sci. Technol. B*, vol. 13, pp. 3012–3016, Dec. 1995.

Lipson et al., *Nature of the Potential Energy Surfaces for the Snl Reaction A Picosecond Kinetic Study of Homolysis and Heterolysis for Diphenylmethyl Chlorides*, J. Am. Chem. Soc., vol. 118, pp. 2992–2997, 1996.

Lorenz et al., *SU–8: a low cost negative resist for MEMS*, J. Micromech. Microeng., vol. 7, pp. 121–124, 1997.

Maiti et al., *Measuring Serotonin Distribution in Live Cells with Three–Photon Excitation*, Science, vol. 275, pp. 445–588, Jan. 1997.

March *Advanced Organic Chemistry: Reactions, Mechanisms and Structure*, Four Edition, 1992, Wiley–Interscience, New York, p. 205.

March *Advanced Organic Chemistry: Reactions, Mechanisms and Structure*, Four Edition, 1992, Wiley–Interscience, New York, Chapter 2.

March *Advanced Organic Chemistry: Reactions, Mechanisms and Structure*, Four Edition, 1992, Wiley–Interscience, New York, Chapter 9.

Maruo et al., *Two–Photon–Absorbed Photopolymerization for Three–Dimensional Microfabrication*, IEEE, The Tenth Annual International Workshop on Micro Electro Mechanical Systems, pp. 169–174, 1997.

Maruo et al., *Three–Dimensional Microfabrication With Two–Photon–Absorbed Photopolymerization*, Optics Letters, vol. 22, No. 2, pp. 132–134, Jan. 1997.

McClelland et al., *Laser Flash Photolysis of 9–Fluorenol. Production and Reactivities of the 9–Fluorenol Radical Cation and the 9–Fluorenyl Cation*, J. Am. Chem. Soc., vol. 112, pp. 4857–4861, 1990.

McClelland et al., *Flash Photolysis Study of a Friedel–Crafts alkylation. Reaction of the Photogenerated 9–Fluorenyl cation with aromatic compounds*, J. Chem. Soc., vol. 2, pp. 1531–1543, 1996.

Odian, *Principles of Polymerization Second Edition* John Wiley & Sons, New York, 1981, pp. 181.

Richardson, *Langmuir–Blodgett Films, An Introduction to Molecular Electronics*, Chapter 10, 1995.

Pitts et al., *Submicro Multiphoton Free–Form Fabrication on Proteins and Polymers: Studies of Reaction Efficiencies and Applications in Sustained Release*, Macromolecules, vol. 33, pp. 1514–1523, 2000.

He et al., *Two–Photon Absorption and Optical–Limiting Properties of Novel Organic Compounds*, Optics Letters, vol. 20, No. 5, pp. 435–437, Mar. 1995.

Parthenopoulos et al., *Three–Dimensional Optical Storage Memory*, Science, vol. 245, pp. 843–845, Aug. 1989.

Shaw et al., *Negative Photoresists for Optical Lithography*, IBM J. Res. Develop., vol. 41, No. ½, pp. 81–94, Jan./Mar. 1997.

Shirai et al., *Photoacid and Photobase Generators: Chemistry and Applications to Polymeric Materials*, Prog. Polym. Sci., vol. 21, pp. 1–45, 1996.

Smith, *Modern Optic Engineering*, 1966, McGraw–Hill, pp. 104–105.

Strickler et al., *Three–Dimensional Optical Data Storage in Refractive Media by Two–Photon Point Excitation*, Optics Letters, vol. 16, No. 22, pp1780–1782, Nov. 1991.

Strickler et al., *3–D Optical Data Storage by Two–Photon Excitation*, Adv. Mater., vol. 5, No. 6, pp. 479, 1993.

Thayumanavan et al., Synthesis of Unsymmetrical Triarylamines for Photonic Applications via One–Pot Palladium–Catalyzed Aminations, *Chem. Mater.*, vol. 9, pp. 3231–3235, 1997.

Wan et al., *Contrasting Photosolvolytic Reactivities of 9–Fluorenol vs. 5–Suberenol Derivatives. Enhanced Rate of Formation of Cyclically Conjugated Four π Carbocations in the Excited State*, J. Am. Chem. Soc., vol. 111, pp. 4887–4895, 1989.

Williams et al., *Two–Photon Molecular Excitation Provides Intrinsic 3–Dimensional Resolution for Laser–based Microscopy and Microphotochemistry*, FASEB Journal, vol. 8, pp. 804–813, Aug. 1994.

Xu et al., *Multiphoton Fluorescence Excitation: New Spectral Windows for Biological Nonlinear Microscopy*, Proc. Natl. Acad. Sci. USA, vol. 93, pp. 10763–10768, Oct. 1996.

Yuste et al., *Dendritic Spines as Basic Functional Units of Neuronal Integration*, Nature, vol. 375, pp. 682–684, Jun. 1995.

Kosar, *Photochemical Formation and Destruction of Dyes, Light–Sensitive Systems*, John Wiley & Sons, New York NY, 1965, Chapter 8.

Badlwinson, *Auxiliaries Associated With Main Dye Classes, Colorants and Auxiliaries*, vol. 2, 1990, Chapter 12.

Syper et al., *Synthesis of Oxiranylquinones as New Potential Bioreductive Alkylating Agents*, Tetrahedron, vol. 39, No. 5, pp. 781–792, 1983.

Zollinger, *Color Chemistry*, VCH, Weinheim, GE, 1991, Chapter 8.

Misawa et al., *Multibeam Laser Manipulation and Fixation of Microparticles*, Appl. Phys. Letter, vol. 60, No. 3, pp. 310–312, Jan. 20, 1992 (XP 002189602).

Sun et al., *Photonic Crystal Structures With Submicrometer Spatial Resolution Achieved By High Power Femtosecond Laser–Induced Photopolymerization*, SPIE, vol. 3888, pp. 122–130, 2000. (XP 001051864).

* cited by examiner

MULTIPHOTON PHOTOSENSITIZATION SYSTEM

STATEMENT OF PRIORITY

This application claims the priority of U.S. Provisional Application No. 60/211,703 filed Jun. 15, 2000, the contents of which are hereby incorporated by reference.

FIELD

This invention relates to multiphoton methods of photo-inducing chemical reactions.

BACKGROUND

Molecular two-photon absorption was predicted by Goppert-Mayer in 1931. Upon the invention of pulsed ruby lasers in 1960, experimental observation of two-photon absorption became a reality. Subsequently, two-photon excitation has found application in biology and optical data storage, as well as in other fields.

There are two key differences between two-photon induced photoprocesses and single-photon induced processes. Whereas single-photon absorption scales linearly with the intensity of the incident radiation, two-photon absorption scales quadratically. Higher-order absorptions scale with a related higher power of incident intensity. As a result, it is possible to perform multiphoton processes with three-dimensional spatial resolution. Also, because multiphoton processes involve the simultaneous absorption of two or more photons, the absorbing chromophore is excited with a number of photons whose total energy equals the energy of an electronic excited state of the multiphoton photosensitizer that is utilized, even though each photon individually has insufficient energy to excite the chromophore. Because the exciting light is not attenuated by single-photon absorption within a curable matrix or material, it is possible to selectively excite molecules at a greater depth within a material than would be possible via single-photon excitation by use of a beam that is focused to that depth in the material. These two phenomena also apply, for example, to excitation within tissue or other biological materials.

Major benefits have been achieved by applying multiphoton absorption to the areas of photocuring and microfabrication. For example, in multiphoton lithography or stereolithography, the nonlinear scaling of multiphoton absorption with intensity has provided the ability to write features having a size that is less than the diffraction limit of the light utilized, as well as the ability to write features in three dimensions (which is also of interest for holography). Such work has been limited, however, to slow writing speeds and high laser powers, due to the low photosensitivities of current multiphoton-activatable, photoreactive compositions. Thus, we recognize that there is a need for methods of improving the photosensitivities of such compositions.

SUMMARY

The present invention provides a method of multiphoton photosensitizing a photoreactive composition. The method comprises irradiating (preferably, pulse irradiating) the composition with light sufficient to cause simultaneous absorption of at least two photons, thereby inducing at least one acid- or radical-initiated chemical reaction where the composition is exposed to the light. The photoreactive composition comprises: (a) at least one reactive species that is capable of undergoing an acid- or radical-initiated chemical reaction (preferably, a curable species; more preferably, a curable species selected from the group consisting of monomers, oligomers, and reactive polymers); and (b) at least one multiphoton photoinitiator system.

The multiphoton photoinitiator system comprises photochemically effective amounts of (1) at least one multiphoton photosensitizer that is capable of simultaneously absorbing at least two photons and that has a two-photon absorption cross-section greater than that of fluorescein (generally, greater than about $50 \times 10^{-50}$ cm$^4$ sec/photon, as measured by the method described by C. Xu and W. W. Webb in J. Opt. Soc. Am. B, 13, 481 (1996)); (2) optionally, at least one electron donor compound different from the multiphoton photosensitizer and capable of donating an electron to an electronic excited state of the photosensitizer (preferably, an electron donor compound having an oxidation potential that is greater than zero and less than or equal to that of p-dimethoxybenzene); and (3) at least one photoinitiator that is capable of being photosensitized by accepting an electron from an electronic excited state of the photosensitizer, resulting in the formation of at least one free radical and/or acid (preferably, a photoinitiator selected from the group consisting of iodonium salts, sulfonium salts, diazonium salts, azinium salts, chloromethylated triazines, and triarylimidazolyl dimers); with the proviso that the multiphoton photoinitiator system comprises at least one electron donor compound whenever the photoreactive composition comprises at least one reactive species that is capable of undergoing an acid-initiated chemical reaction and that is either a curable species or a non-curable, reactive polymer.

The method of the invention provides enhanced multiphoton photosensitivity by combining (in photochemically-effective amounts) multiphoton photosensitizers having relatively large two-photon absorption cross sections (compared to those of many commonly-available dyes) with photoinitiators that are further enhanced by electron donors so as to efficiently form reaction-initiating species (radicals, acids, etc.). The increased sensitivity of the method of the invention provides utility by, for example, allowing rapid fabrication of three-dimensional structures and permitting the use of lower peak intensity lasers (including, for example, robust industrial lasers such as nanosecond and picosecond Nd:YAG lasers) for exposure.

In another aspect, this invention also provides a novel multiphoton-activatable, photoreactive composition comprising (a) at least one reactive species that is capable of undergoing an acid- or radical-initiated chemical reaction other than a curing reaction; and (b) at least one multiphoton photoinitiator system comprising photochemically effective amounts of (1) at least one multiphoton photosensitizer that is capable of simultaneously absorbing at least two photons, (2) at least one electron donor compound that is different from the multiphoton photosensitizer, different from the reactive species, and capable of donating an electron to an electronic excited state of the photosensitizer, and (3) at least one photoinitiator that is capable of being photosensitized by accepting an electron from an electronic excited state of the photosensitizer, resulting in the formation of at least one free radical and/or acid; with the proviso that the composition contains no curable species.

BRIEF DESCRIPTION OF THE DRAWINGS

These and other features, aspects, and advantages of the present invention will become better understood with regard to the following description, appended claims, and accompanying drawings, wherein:

DETAILED DESCRIPTION

Definitions

Figure 1:
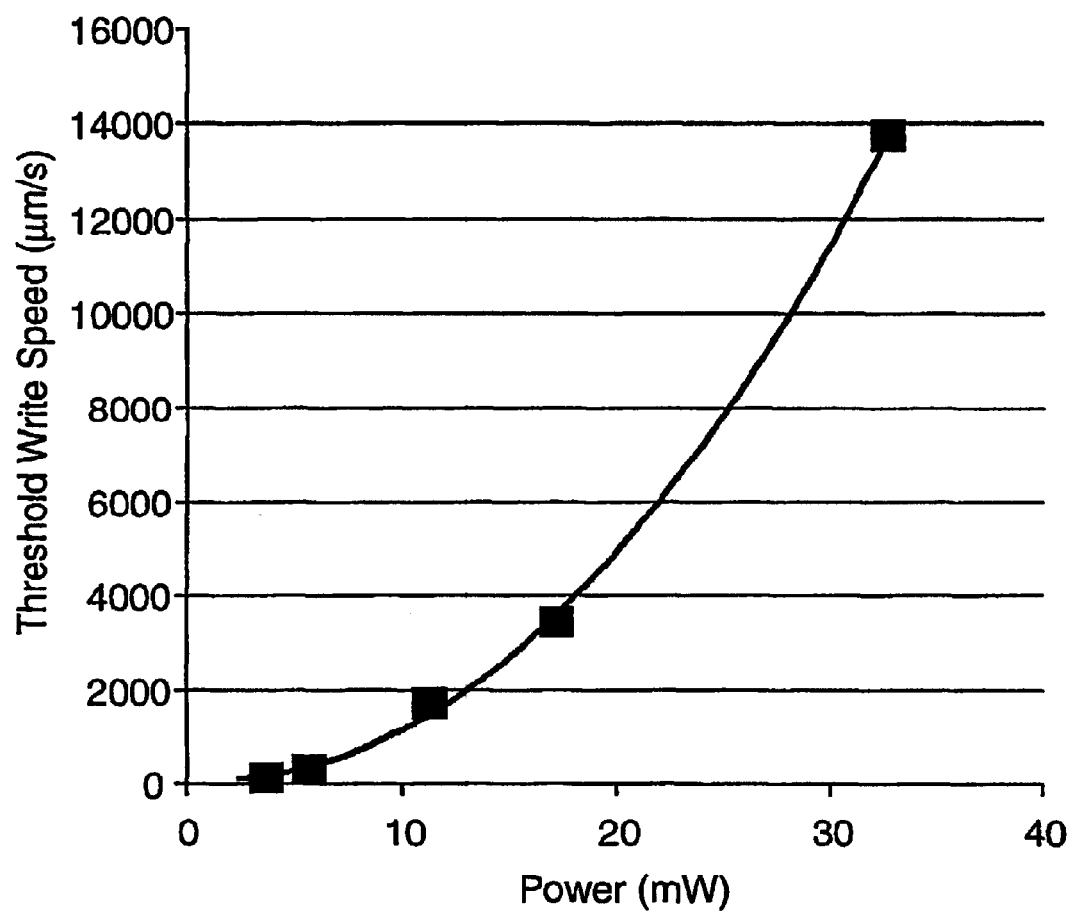
FIG. 1 is a plot of threshold write speed (in micrometers per second) versus power (in milliwatts) for the coated films of Example 7, infra.

As used in this patent application:

"multiphoton absorption" means simultaneous absorption of two or more photons to reach a reactive, electronic excited state that is energetically inaccessible by the absorption of a single photon of the same energy;

"simultaneous" means two events that occur within the period of $10^{-14}$ seconds or less;

"electronic excited state" means an electronic state of a molecule that is higher in energy than the molecule's electronic ground state, that is accessible via absorption of electromagnetic radiation, and that has a lifetime greater than $10^{-13}$ seconds;

"cure" means to effect polymerization and/or to effect crosslinking;

"optical system" means a system for controlling light, the system including at least one element chosen from refractive optical elements such as lenses, reflective optical elements such as mirrors, and diffractive optical elements such as gratings. Optical elements shall also include diffusers, waveguides, and other elements known in the optical arts;

"three-dimensional light pattern" means an optical image wherein the light energy distribution resides in a volume or in multiple planes and not in a single plane;

"exposure system" means an optical system plus a light source;

"sufficient light" means light of sufficient intensity and appropriate wavelength to effect multiphoton absorption;

"photosensitizer" means a molecule that lowers the energy required to activate a photoinitiator by absorbing light of lower energy than is required by the photoinitiator for activation and interacting with the photoinitiator to produce a photoinitiating species therefrom; and "photochemically effective amounts" (of the components of the photoinitiator system) means amounts sufficient to enable the reactive species to undergo at least partial reaction under the selected exposure conditions (as evidenced, for example, by a change in density, viscosity, color, pH, refractive index, or other physical or chemical property).

Reactive Species

Reactive species suitable for use in the photoreactive compositions include both curable and non-curable species. Curable species are generally preferred and include, for example, addition-polymerizable monomers and oligomers and addition-crosslinkable polymers (such as free-radically polymerizable or crosslinkable ethylenically-unsaturated species including, for example, acrylates, methacrylates, and certain vinyl compounds such as styrenes), as well as cationically-polymerizable monomers and oligomers and cationically-crosslinkable polymers (which species are most commonly acid-initiated and which include, for example, epoxies, vinyl ethers, cyanate esters, etc.), and the like, and mixtures thereof.

Suitable ethylenically-unsaturated species are described, for example, by Palazzotto et al. in U.S. Pat. No. 5,545,676 at column 1, line 65, through column 2, line 26, and include mono-, di-, and poly-acrylates and methacrylates (for example, methyl acrylate, methyl methacrylate, ethyl acrylate, isopropyl methacrylate, n-hexyl acrylate, stearyl acrylate, allyl acrylate, glycerol diacrylate, glycerol triacrylate, ethyleneglycol diacrylate, diethyleneglycol diacrylate, triethyleneglycol dimethacrylate,1,3-propanediol diacrylate, 1,3-propanediol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyldimethylmethane, bis[1-(3-acryloxy-2-hydroxy)]-p-propoxyphenyldimethylmethane, trishydroxyethyl-isocyanurate trimethacrylate, the bis-acrylates and bis-methacrylates of polyethylene glycols of molecular weight about 200–500, copolymerizable mixtures of acrylated monomers such as those of U.S. Pat. No. 4,652,274, and acrylated oligomers such as those of U.S. Pat. No. 4,642,126); unsaturated amides (for example, methylene bis-acrylamide, methylene bis-methacrylamide, 1,6-hexamethylene bis-acrylamide, diethylene triamine tris-acrylamide and beta-methacrylaminoethyl methacrylate); vinyl compounds (for example, styrene, diallyl phthalate, divinyl succinate, divinyl adipate, and divinyl phthalate); and the like; and mixtures thereof. Suitable reactive polymers include polymers with pendant (meth)acrylate groups, for example, having from 1 to about 50 (meth)acrylate groups per polymer chain. Examples of such polymers include aromatic acid (meth)acrylate half ester resins such as Sarbox™ resins available from Sartomer (for example, Sarbox™ 400, 401, 402, 404, and 405). Other useful reactive polymers curable by free radical chemistry include those polymers that have a hydrocarbyl backbone and pendant peptide groups with free-radically polymerizable functionality attached thereto, such as those described in U.S. Pat. No. 5,235,015 (Ali et al.). Mixtures of two or more monomers, oligomers, and/or reactive polymers can be used if desired. Preferred ethylenically-unsaturated species include acrylates, aromatic acid (meth)acrylate half ester resins, and polymers that have a hydrocarbyl backbone and pendant peptide groups with free-radically polymerizable functionality attached thereto.

Suitable cationically-reactive species are described, for example, by Oxman et al. in U.S. Pat. Nos. 5,998,495 and 6,025,406 and include epoxy resins. Such materials, broadly called epoxides, include monomeric epoxy compounds and epoxides of the polymeric type and can be aliphatic, alicyclic, aromatic, or heterocyclic. These materials generally have, on the average, at least 1 polymerizable epoxy group per molecule (preferably, at least about 1.5 and, more preferably, at least about 2). The polymeric epoxides include linear polymers having terminal epoxy groups (for example, a diglycidyl ether of a polyoxyalkylene glycol), polymers having skeletal oxirane units (for example, polybutadiene polyepoxide), and polymers having pendant epoxy groups (for example, a glycidyl methacrylate polymer or copolymer). The epoxides can be pure compounds or can be mixtures of compounds containing one, two, or more epoxy groups per molecule. These epoxy-containing materials can vary greatly in the nature of their backbone and substituent groups. For example, the backbone can be of any type and substituent groups thereon can be any group that does not substantially interfere with cationic cure at room temperature. Illustrative of permissible substituent groups include halogens, ester groups, ethers, sulfonate groups, siloxane groups, nitro groups, phosphate groups, and the like. The molecular weight of the epoxy-containing materials can vary from about 58 to about 100,000 or more.

Useful epoxy-containing materials include those which contain cyclohexene oxide groups such as epoxycyclohexanecarboxylates, typified by 3,4-epoxycyclohexylmethyl-3,4-epoxycyclohexanecarboxylate, 3,4-epoxy-2-methylcyclohexylmethyl-3,4-epoxy-2-methylcyclohexane carboxylate, and bis(3,4-epoxy-6- methylcyclohexylmethyl)adipate. A more detailed list of useful epoxides of this nature is set forth in U.S. Pat. No. 3,117,099.

Other epoxy-containing materials that are useful include glycidyl ether monomers of the formula

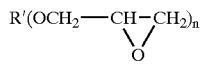

where R' is alkyl or aryl and n is an integer of 1 to 6. Examples are glycidyl ethers of polyhydric phenols obtained by reacting a polyhydric phenol with an excess of a chlorohydrin such as epichlorohydrin (for example, the diglycidyl ether of 2,2-bis-(2,3-epoxypropoxyphenol)-propane). Additional examples of epoxides of this type are described in U.S. Pat. No. 3,018,262, and in *Handbook of Epoxy Resins,* Lee and Neville, McGraw-Hill Book Co., New York (1967).

Numerous commercially available epoxy resins can also be utilized. In particular, epoxides that are readily available include octadecylene oxide, epichlorohydrin, styrene oxide, vinyl cyclohexene oxide, glycidol, glycidylmethacrylate, diglycidyl ethers of Bisphenol A (for example, those available under the trade designations Epon™ 828, Epon™ 825, Epon™ 1040, and Epon™ 1010 from Resolution Performance Products, formerly Shell Chemical Co., as well as DER™-331, DER™-332, and DER™-334 from Dow Chemical Co.), vinylcyclohexene dioxide (for example, ERL-4206 from Union Carbide Corp.), 3,4-epoxycyclohexylmethyl-3,4-epoxycyclohexene carboxylate (for example, ERL-4221 or Cyracure™ UVR 6110 or UVR 6105 from Union Carbide Corp.), 3,4-epoxy-6-methylcyclohexylmethyl-3,4-epoxy-4-methyl-cyclohexene carboxylate (for example, ERL-4201 from Union Carbide Corp.), bis(3,4-epoxy-6-methylcyclohexylmethyl)adipate (for example. ERL-4289 from Union Carbide Corp.), bis(2,3-epoxycyclopentyl) ether (for example, ERL-0400 from Union Carbide Corp.), aliphatic epoxy modified from polypropylene glycol (for example, ERL-4050 and ERL-4052 from Union Carbide Corp.), dipentene dioxide (for example, ERL-4269 from Union Carbide Corp.), epoxidized polybutadiene (for example. Oxiron™ 2001 from FMC Corp.), silicone resin containing epoxy functionality, flame retardant epoxy resins (for example, DER™-580, a brominated bisphenol type epoxy resin available from Dow Chemical Co.) 1,4-butanediol diglycidyl ether of phenol-formaldehyde novolak (for example, DEN™-431 and DEN™-438 from Dow Chemical Co.), resorcinol diglycidyl ether (for example, Kopoxite™ from Koppers Company, Inc.), bis(3,4-epoxycyclohexyl)adipate (for example, ERL-4299 or UVR-6128, from Union Carbide Corp.), 2-(3,4-epoxycyclohexyl-5,5-spiro-3,4-epoxy)cyclohexane-meta-dioxane (for example, ERL-4234 from Union Carbide Corp.), vinylcyclohexene monoxide 1,2-epoxyhexadecane (for example, UVR-6216 from Union Carbide Corp.), alkyl glycidyl ethers such as alkyl $C_8$–$C_{10}$ glycidyl ether (for example, Heloxy™ Modifier 7 from Resolution Performance Products), alkyl $C_{12}$–$C_{14}$ glycidyl ether (for example, Heloxy™ Modifier 8 from Resolution Performance Products), butyl glycidyl ether (for example, Heloxy™ Modifier 61 from Resolution Performance Products), cresyl glycidyl ether (for example, Heloxy™ Modifier 62 from Resolution Performance Products), p-tert-butylphenyl glycidyl ether (for example, Heloxy™ Modifier 65 from Resolution Performance Products), polyfunctional glycidyl ethers such as diglycidyl ether of 1,4-butanediol (for example, Heloxy™ Modifier 67 from Resolution Performance Products), diglycidyl ether of neopentyl glycol (for example, Heloxy™ Modifier 68 from Resolution Performance Products), diglycidyl ether of cyclohexanedimethanol (for example, Heloxy™ Modifier 107 from Resolution Performance Products), trimethylol ethane triglycidyl ether (for example, Heloxy™ Modifier 44 from Resolution Performance Products), trimethylol propane triglycidyl ether (for example, Heloxy™ Modifier 48 from Resolution Performance Products), polyglycidyl ether of an aliphatic polyol (for example, Heloxy™ Modifier 84 from Resolution Performance Products), polyglycol diepoxide (for example, Heloxy™ Modifier 32 from Resolution Performance Products), bisphenol F epoxides (for example, Epon™-1138 or GY-281 from Ciba-Geigy Corp.), and 9,9-bis[4-(2,3-epoxypropoxy)-phenyl]fluorenone (for example, Epon™ 1079 from Resolution Performance Products).

Other useful epoxy resins comprise copolymers of acrylic acid esters of glycidol (such as glycidylacrylate and glycidylmethacrylate) with one or more copolymerizable vinyl compounds. Examples of such copolymers are 1:1 styrene-glycidylmethacrylate, 1:1 methylmethacrylate-glycidylacrylate, and a 62.5:24:13.5 methylmethacrylate-ethyl acrylate-glycidylmethacrylate. Other useful epoxy resins are well known and contain such epoxides as epichlorohydrins, alkylene oxides (for example, propylene oxide), styrene oxide, alkenyl oxides (for example, butadiene oxide), and glycidyl esters (for example, ethyl glycidate).

Useful epoxy-functional polymers include epoxy-functional silicones such as those described in U.S. Pat. No. 4,279,717 (Eckberg), which are commercially available from the General Electric Company. These are polydimethylsiloxanes in which 1–20 mole % of the silicon atoms have been substituted with epoxyalkyl groups (preferably, epoxy cyclohexylethyl, as described in U.S. Pat. No. 5,753,346 (Kessel)).

Blends of various epoxy-containing materials can also be utilized. Such blends can comprise two or more weight average molecular weight distributions of epoxy-containing compounds (such as low molecular weight (below 200), intermediate molecular weight (about 200 to 10,000), and higher molecular weight (above about 10,000)). Alternatively or additionally, the epoxy resin can contain a blend of epoxy-containing materials having different chemical natures (such as aliphatic and aromatic) or functionalities (such as polar and non-polar). Other cationically-reactive polymers (such as vinyl ethers and the like) can additionally be incorporated, if desired.

Preferred epoxies include aromatic glycidyl epoxies (such as the Epon™ resins available from Resolution Performance Products) and cycloaliphatic epoxies (such as ERL-4221 and ERL-4299 available from Union Carbide).

Suitable cationally-reactive species also include vinyl ether monomers, oligomers, and reactive polymers (for example, methyl vinyl ether, ethyl vinyl ether, tert-butyl vinyl ether, isobutyl vinyl ether, triethyleneglycol divinyl ether (Rapi-Cure™ DVE-3, available from International Specialty Products, Wayne, N.J.), trimethylolpropane trivinyl ether (TMPTVE, available from BASF Corp., Mount Olive, N.J.), and the Vectomer™ divinyl ether resins from Allied Signal (for example, Vectomer™ 2010, Vectomer™ 2020, Vectomer™ 4010, and Vectomer™ 4020 and their equivalents available from other manufacturers)), and mixtures thereof. Blends (in any proportion) of one or more vinyl ether resins and/or one or more epoxy resins can also be utilized. Polyhydroxy-functional materials (such as those described, for example, in U.S. Pat. No. 5,856,373 (Kaisaki et al.)) can also be utilized in combination with epoxy- and/or vinyl ether-functional materials.

Non-curable species include, for example, reactive polymers whose solubility can be increased upon acid- or radical-induced reaction. Such reactive polymers include, for example, aqueous insoluble polymers bearing ester groups that can be converted by photogenerated acid to aqueous soluble acid groups (for example, poly(4-tert-butoxycarbonyloxystyrene). Non-curable species also include the chemically-amplified photoresists described by R. D. Allen, G. M. Wallraff, W. D. Hinsberg, and L. L. Simpson in "High Performance Acrylic Polymers for Chemically Amplified Photoresist Applications," J. Vac. Sci. Technol. B, 9, 3357 (1991). The chemically-amplified photoresist concept is now widely used for microchip manufacturing, especially with sub-0.5 micron (or even sub-0.2 micron) features. In such photoresist systems, catalytic species (typically hydrogen ions) can be generated by irradiation, which induces a cascade of chemical reactions. This cascade occurs when hydrogen ions initiate reactions that generate more hydrogen ions or other acidic species, thereby amplifying reaction rate. Examples of typical acid-catalyzed chemically-amplified photoresist systems include deprotection (for example, t-butoxycarbonyloxystyrene resists as described in U.S. Pat. No. 4,491,628, tetrahydropyran (THP) methacrylate-based materials, THP-phenolic materials such as those described in U.S. Pat. No. 3,779,778, t-butyl methacrylate-based materials such as those described by R. D Allen et al. in Proc. SPIE 2438, 474 (1995), and the like); depolymerization (for example, polyphthalaldehyde-based materials); and rearrangement (for example, materials based on the pinacol rearrangements).

Useful non-curable species also include leuco dyes, which tend to be colorless until they are oxidized by acid generated by the multiphoton photoinitiator system, and which, once oxidized, exhibit a visible color. (Oxidized dyes are colored by virtue of their absorbance of light in the visible portion of the electromagnetic spectrum (approximately 400–700 nm).) Leuco dyes useful in the present invention are those that are reactive or oxidizable under moderate oxidizing conditions and yet that are not so reactive as to oxidize under common environmental conditions. There are many such chemical classes of leuco dyes known to the imaging chemist.

Leuco dyes useful as reactive species in the present invention include acrylated leuco azine, phenoxazine, and phenothiazine, which can, in part, be represented by the structural formula:

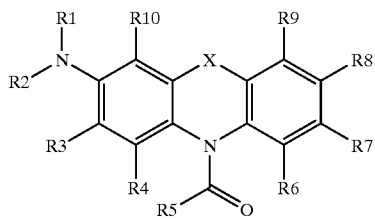

wherein X is selected from O, S, and —N—$R^{11}$, with S being preferred; $R^1$ and $R^2$ are independently selected from H and alkyl groups of 1 to about 4 carbon atoms; $R^3$, $R^4$, $R^6$, and $R^7$ are independently selected from H and alkyl groups of 1 to about 4 carbon atoms, preferably methyl; $R^5$ is selected from alkyl groups of 1 to about 16 carbon atoms, alkoxy groups of 1 to about 16 carbon atoms, and aryl groups of up to about 16 carbon atoms; $R^8$ is selected from —N($R^1$)($R^2$), H, alkyl groups of 1 to about 4 carbon atoms, wherein $R^1$ and $R^2$ are independently selected and defined as above; $R^9$ and $R^{10}$ are independently selected from H and alkyl groups of 1 to about 4 carbon atoms; and $R^{11}$ is selected from alkyl groups of 1 to about 4 carbon atoms and aryl groups of up to about 11 carbon atoms (preferably, phenyl groups). The following compounds are examples of this type of leuco dye:

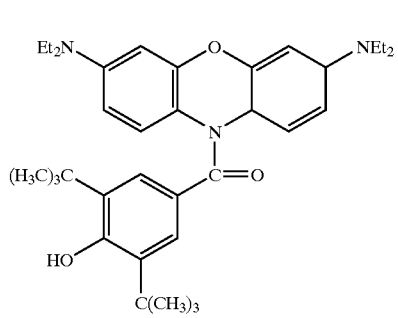

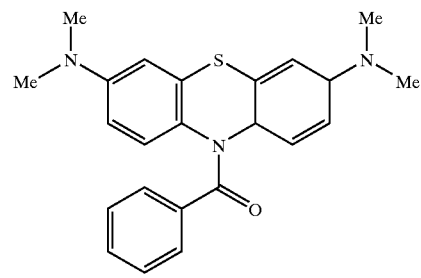

Copichern II

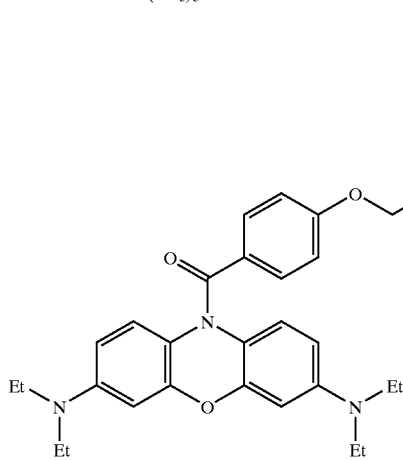

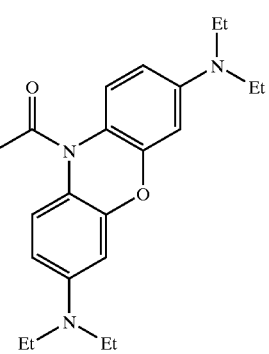

Other useful leuco dyes include, but are not limited to, Leuco Crystal Violet (4,4',4"-methylidynetris-(N,N-diethylaniline)), Leuco Malachite Green (p,p'-benzylidenebis-(N,N-dimethylaniline)), Leuco Atacryl Orange-LGM (Color Index Basic Orange 21, Comp. No. 48035 (a Fischer's base type compound)) having the structure

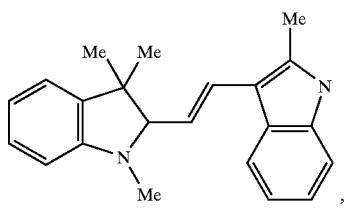

Leuco Atacryl Brilliant Red-4G (Color Index Basic Red 14) having the structure

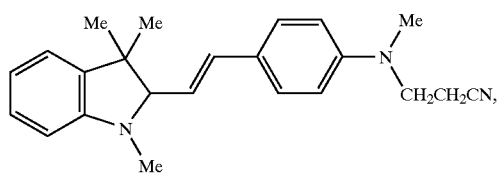

Leuco Atacryl Yellow-R (Color Index Basic Yellow 11, Comp. No. 48055) having the structure

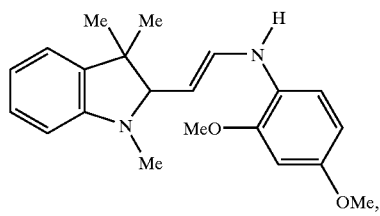

Leuco Ethyl Violet (4,4',4"-methylidynetris-(N,N-diethylaniline), Leuco Victoria Blu-BGO (Color Index Basic Blue 728a, Comp. No. 44040; 4,4'-methylidynebis-(N,N,-dimethylaniline)-4-(N-ethyl-1-napthalamine)), and Leuco Atlantic Fuchsine Crude (4,4',4"-methylidynetris-aniline).

The leuco dye(s) can generally be present at levels of at least about 0.01% by weight of the total weight of a light sensitive layer (preferably, at least about 0.3% by weight; more preferably, at least about 1% by weight; most preferably, at least about 2% to 10% or more by weight). Other materials such as binders, plasticizers, stabilizers, surfactants, antistatic agents, coating aids, lubricants, fillers, and the like can also be present in the light sensitive layer.

If desired, mixtures of different types of reactive species can be utilized in the photoreactive compositions. For example, mixtures of free-radically-reactive species and cationically-reactive species, mixtures of curable species and non-curable species, and so forth, are also useful.

Photoinitiator System (1) Multiphoton Photosensitizers

Multiphoton photosensitizers suitable for use in the multiphoton photoinitiator system of the photoreactive compositions are those that are capable of simultaneously absorbing at least two photons when exposed to sufficient light and that have a two-photon absorption cross-section greater than that of fluorescein (that is, greater than that of 3',6'-dihydroxyspiro[isobenzofuran-1(3H), 9'-[9H]xanthen]3-one). Generally, the cross-section can be greater than about $50 \times 10^{-50}$ cm$^4$ sec/photon, as measured by the method described by C. Xu and W. W. Webb in J. Opt. Soc. Am. B, 13, 481 (1996) (which is referenced by Marder and Perry et al. in International Publication No. WO 98/21521 at page 85, lines 18–22).

This method involves the comparison (under identical excitation intensity and photosensitizer concentration conditions) of the two-photon fluorescence intensity of the photosensitizer with that of a reference compound. The reference compound can be selected to match as closely as possible the spectral range covered by the photosensitizer absorption and fluorescence. In one possible experimental set-up, an excitation beam can be split into two arms, with 50% of the excitation intensity going to the photosensitizer and 50% to the reference compound. The relative fluorescence intensity of the photosensitizer with respect to the reference compound can then be measured using two photomultiplier tubes or other calibrated detector. Finally, the fluorescence quantum efficiency of both compounds can be measured under one-photon excitation.

Methods of determining fluorescence and phosphorescence quantum yields are well-known in the art. Typically, the area under the fluorescence (or phosphorescence) spectrum of a compound of interest is compared with the area under the fluorescence (or phosphorescence) spectrum of a standard luminescent compound having a known fluorescence (or phosphorescence) quantum yield, and appropriate corrections are made (which take into account, for example, the optical density of the composition at the excitation wavelength, the geometry of the fluorescence detection apparatus, the differences in the emission wavelengths, and the response of the detector to different wavelengths). Standard methods are described, for example, by I. B. Berlman in *Handbook of Fluorescence Spectra of Aromatic Molecules,* Second Edition, pages 24–27, Academic Press, New York (1971); by J. N. Demas and G. A. Crosby in J. Phys. Chem. 75, 991–1024 (1971); and by J. V. Morris, M. A. Mahoney, and J. R. Huber in J. Phys. Chem. 80, 969–974 (1976).

Assuming that the emitting state is the same under one- and two-photon excitation (a common assumption), the two-photon absorption cross-section of the photosensitizer, ($\delta_{sam}$), is equal to $\delta_{ref}$ K ($I_{sam}/I_{ref}$)($\Phi_{sam}/\Phi_{ref}$), wherein $\delta_{ref}$ is the two-photon absorption cross-section of the reference compound, $I_{sam}$ the fluorescence intensity of the photosensitizer, $I_{ref}$ is the fluorescence intensity of the reference compound, $\Phi_{sam}$ is the fluorescence quantum efficiency of the photosensitizer, $\Phi_{ref}$ is the fluorescence quantum efficiency of the reference compound, and K is a correction factor to account for slight differences in the optical path and response of the two detectors. K can be determined by measuring the response with the same photosensitizer in both the sample and reference arms. To ensure a valid measurement, the clear quadratic dependence of the two-photon fluorescence intensity on excitation power can be confirmed, and relatively low concentrations of both the photosensitizer and the reference compound can be utilized (to avoid fluorescence reabsorption and photosensitizer aggregration effects).

When the photosensitizer is not fluorescent, the yield of electronic excited states can to be measured and compared with a known standard. In addition to the above-described method of determining fluorescence yield, various methods of measuring excited state yield are known (including, for example, transient absorbance, phosphorescence yield, photoproduct formation or disappearance of photosensitizer (from photoreaction), and the like).

Preferably, the two-photon absorption cross-section of the photosensitizer is greater than about 1.5 times that of fluorescein (or, alternatively, greater than about $75 \times 10^{-50}$ cm$^4$ sec/photon, as measured by the above method); more preferably, greater than about twice that of fluorescein (or, alternatively, greater than about $100 \times 10^{-50}$ cm$^4$ sec/photon); most preferably, greater than about three times that of fluorescein (or, alternatively, greater than about $150 \times 10^{-50}$ cm$^4$ sec/photon); and optimally, greater than about four times that of fluorescein (or, alternatively, greater than about $200 \times 10^{-50}$ cm$^4$ sec/photon).

Preferably, the photosensitizer is soluble in the reactive species (if the reactive species is liquid) or is compatible with the reactive species and with any binders (as described below) that are included in the composition. Most preferably, the photosensitizer is also capable of sensitizing 2-methyl-4,6-bis(trichloromethyl)-s-triazine under continuous irradiation in a wavelength range that overlaps the single photon absorption spectrum of the photosensitizer (single photon absorption conditions), using the test procedure described in U.S. Pat. No. 3,729,313. Using currently available materials, that test can be carried out as follows:

A standard test solution can be prepared having the following composition: 5.0 parts of a 5% (weight by volume) solution in methanol of 45,000–55,000 molecular weight, 9.0–13.0% hydroxyl content polyvinyl butyral (Butvar™ B76, Monsanto); 0.3 parts trimethylolpropane trimethacrylate; and 0.03 parts 2-methyl-4,6-bis(trichloromethyl)-s-triazine (see Bull. Chem. Soc. Japan, 42, 2924–2930 (1969)). To this solution can be added 0.01 parts of the compound to be tested as a photosensitizer. The resulting solution can then be knife-coated onto a 0.05 mm clear polyester film using a knife orifice of 0.05 mm, and the coating can be air dried for about 30 minutes. A 0.05 mm clear polyester cover film can be carefully placed over the dried but soft and tacky coating with minimum entrapment of air. The resulting sandwich construction can then be exposed for three minutes to 161,000 Lux of incident light from a tungsten light source providing light in both the visible and ultraviolet range (FCH™ 650 watt quartz-iodine lamp, General Electric). Exposure can be made through a stencil so as to provide exposed and unexposed areas in the construction. After exposure the cover film can be removed, and the coating can be treated with a finely divided colored powder, such as a color toner powder of the type conventionally used in xerography. If the tested compound is a photosensitizer, the trimethylolpropane trimethacrylate monomer will be polymerized in the light-exposed areas by the light-generated free radicals from the 2-methyl-4,6-bis(trichloromethyl)-s-triazine. Since the polymerized areas will be essentially tack-free, the colored powder will selectively adhere essentially only to the tacky, unexposed areas of the coating, providing a visual image corresponding to that in the stencil.

Preferably, a photosensitizer can also be selected based in part upon shelf stability considerations. Accordingly, selection of a particular photosensitizer can depend to some extent upon the particular reactive species utilized (as well as upon the choices of electron donor compound and/or photoinitiator).

Particularly preferred multiphoton photosensitizers include those exhibiting large multiphoton absorption cross-sections, such as Rhodamine B (that is, N-[9-(2-carboxyphenyl)-6-(diethylamino)-3H-xanthen-3-ylidene]-N-ethylethanaminium chloride or hexafluoroantimonate) and the four classes of photosensitizers described, for example, by Marder and Perry et al. in International Patent Publication Nos. WO 98/21521 and WO 99/53242. The four classes can be described as follows: (a) molecules in which two donors are connected to a conjugated π (pi)-electron bridge; (b) molecules in which two donors are connected to a conjugated π (pi)-electron bridge which is substituted with one or more electron accepting groups; (c) molecules in which two acceptors are connected to a conjugated π (pi)-electron bridge; and (d) molecules in which two acceptors are connected to a conjugated π (pi)-electron bridge which is substituted with one or more electron donating groups (where "bridge" means a molecular fragment that connects two or more chemical groups, "donor" means an atom or group of atoms with a low ionization potential that can be bonded to a conjugated π (pi)-electron bridge, and "acceptor" means an atom or group of atoms with a high electron affinity that can be bonded to a conjugated π (pi)-electron bridge).

Representative examples of such preferred photosensitizers include the following:

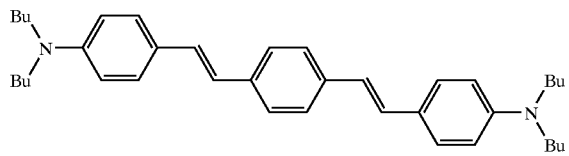

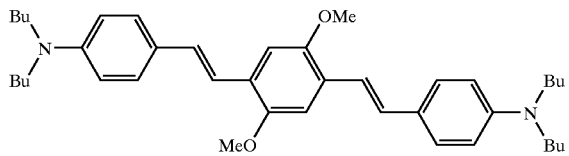

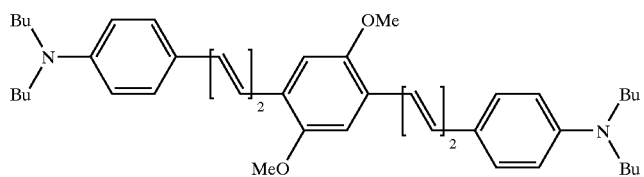

-continued
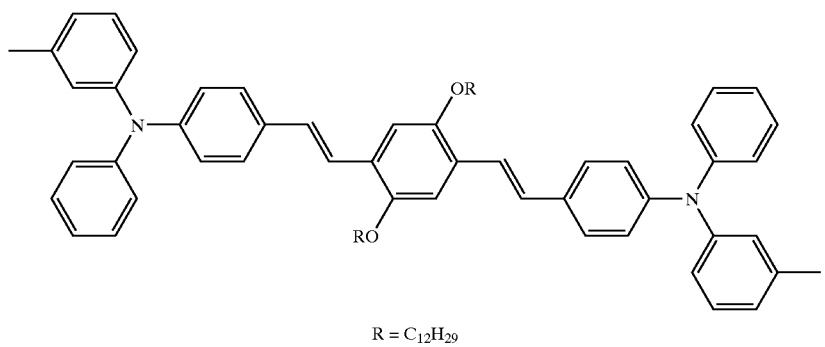
R = C₁₂H₂₉
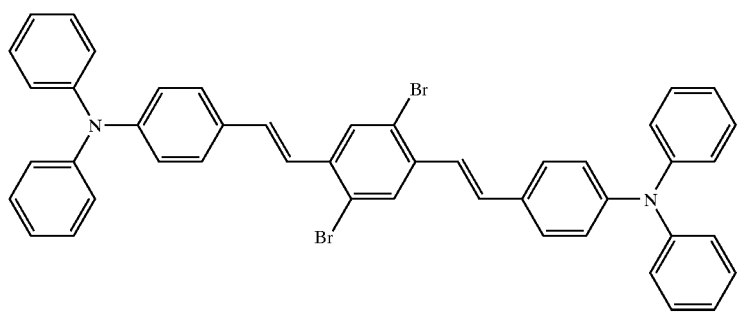
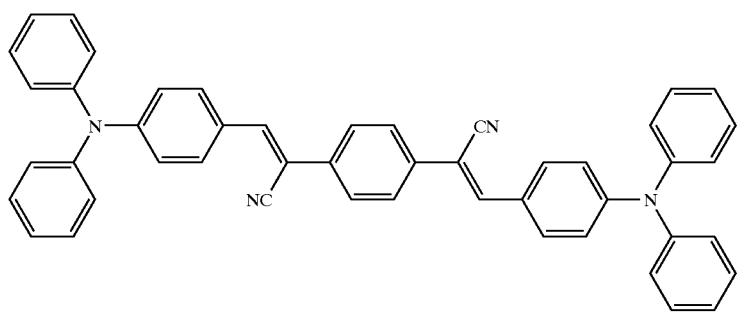
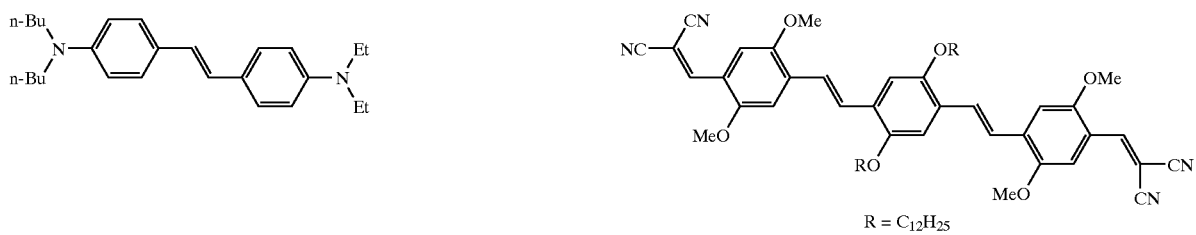
R = C₁₂H₂₅
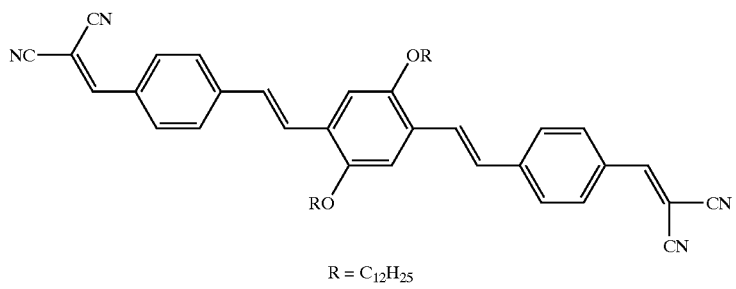
R = C₁₂H₂₅

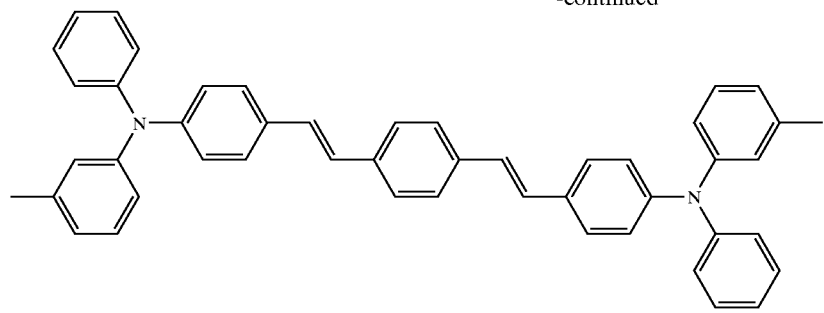
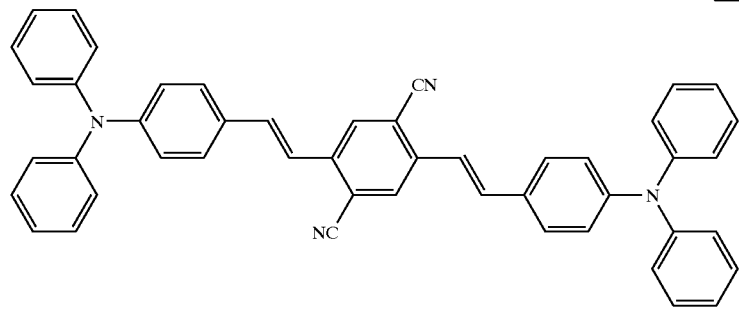
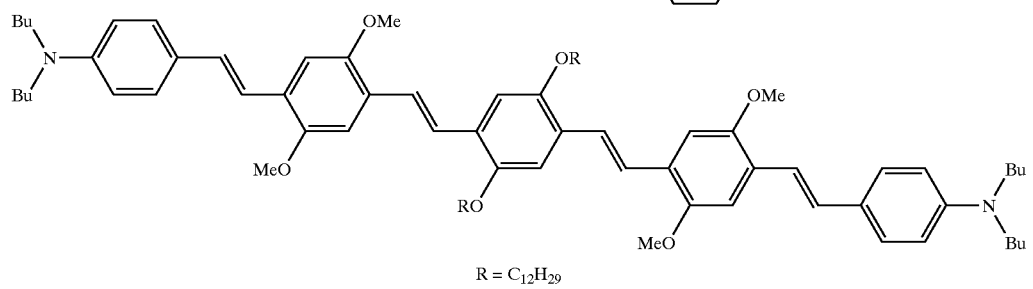
R = C₁₂H₂₉
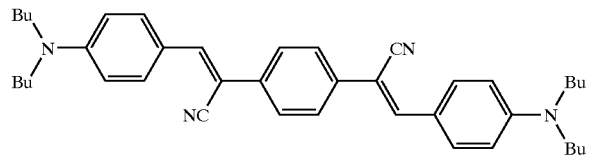
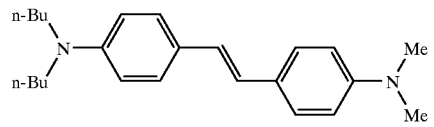
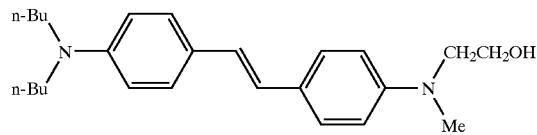
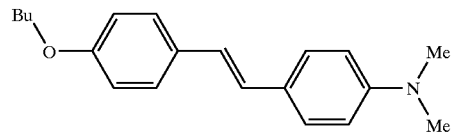
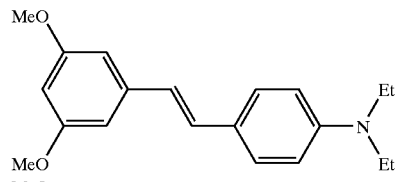
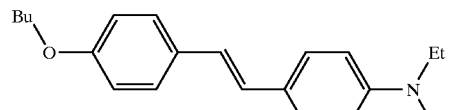
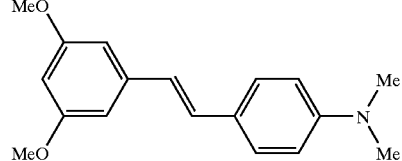
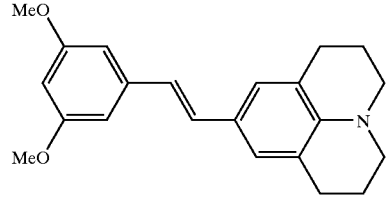
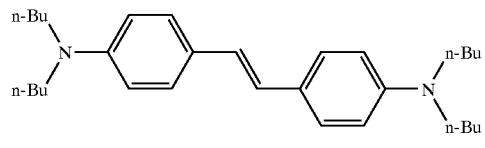
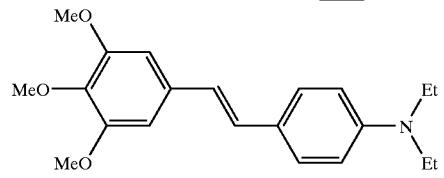

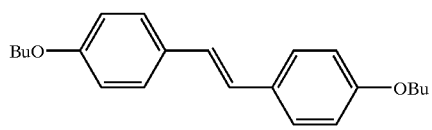

-continued

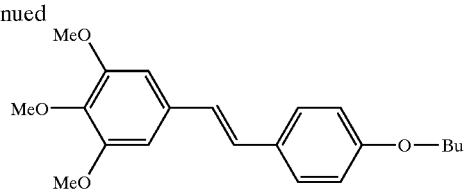

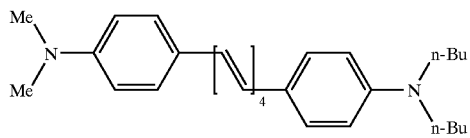

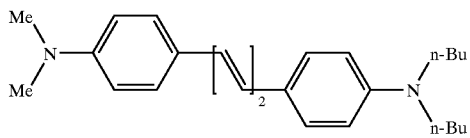

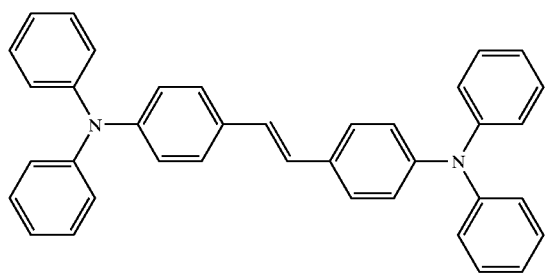

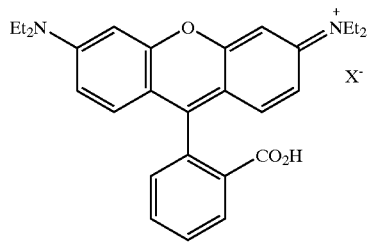

where X⁻ = Cl⁻, $PF_6^-$, $SbF_6^-$, $AsF_6^-$, $BF_4^-$, $CF_3SO_3^-$

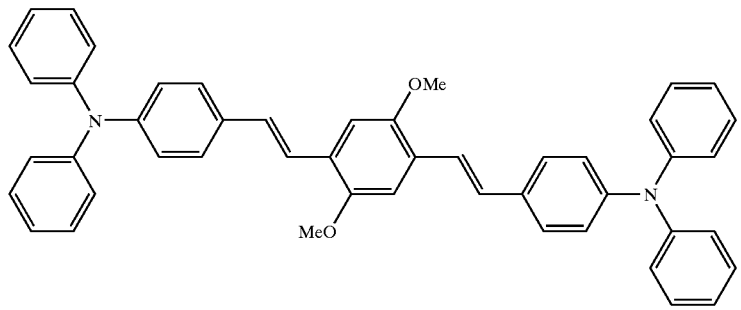

The four above-described classes of photosensitizers can be prepared by reacting aldehydes with ylides under standard Wittig conditions or by using the McMurray reaction, as detailed in International Patent Publication No. WO 98/21521.

Other compounds are described by Reinhardt et al. (for example, in U.S. Pat. Nos. 6,100,405, 5,859,251, and 5,770,737) as having large multiphoton absorption cross-sections, although these cross-sections were determined by a method other than that described above. Representative examples of such compounds include:

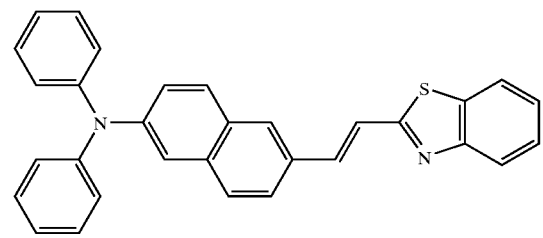

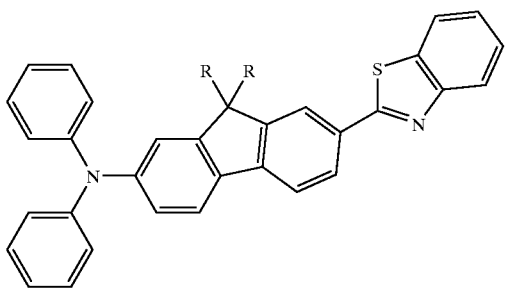

R = R = C2H5, C10H21, C18H37

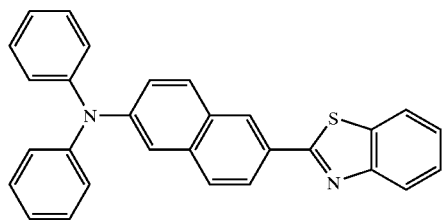
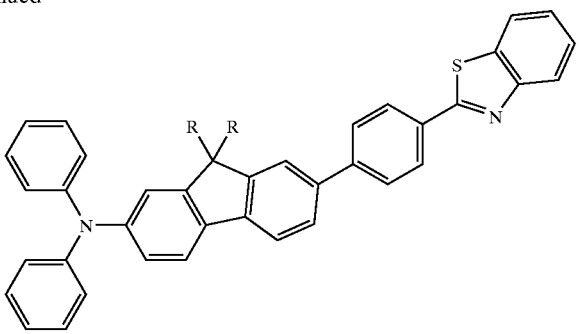

R = C₂H₅

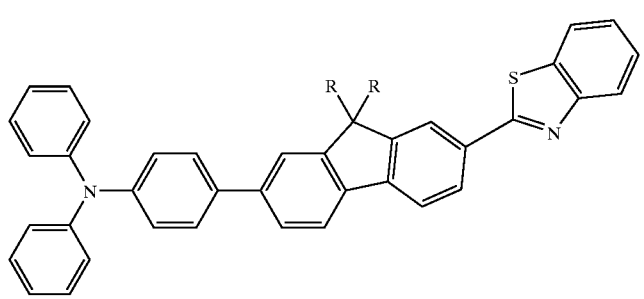

R = C₂H₅

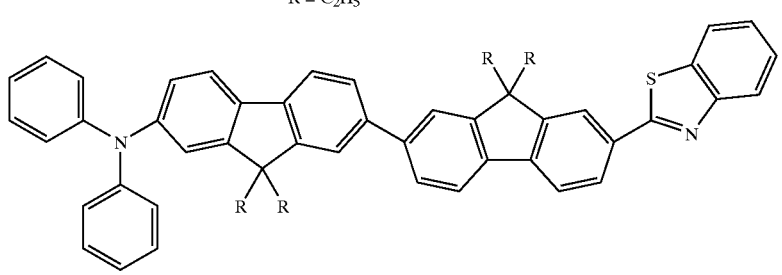

R = C₂H₅

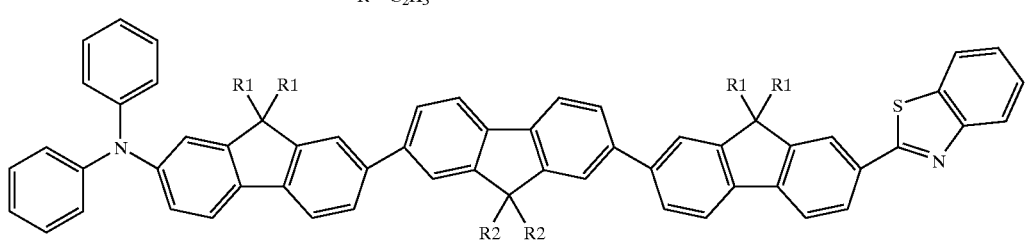

R1 = C₂H₅
R2 = C₁₀H₂₁

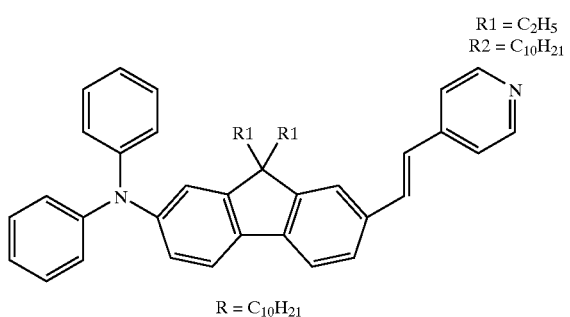

R = C₁₀H₂₁

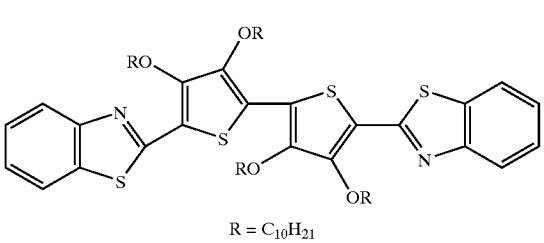

R = C₁₀H₂₁

(2) Electron Donor Compounds

Electron donor compounds useful in the multiphoton photoinitiator system of the photoreactive compositions are those compounds (other than the photosensitizer itself) that are capable of donating an electron to an electronic excited state of the photosensitizer. Such compounds may be used, optionally, to increase the multiphoton photosensitivity of the photoinitiator system, thereby reducing the exposure required to effect photoreaction of the photoreactive composition. The electron donor compounds preferably have an oxidation potential that is greater than zero and less than or equal to that of p-dimethoxybenzene. Preferably, the oxidation potential is between about 0.3 and 1 volt vs. a standard saturated calomel electrode ("S.C.E.").

The electron donor compound is also preferably soluble in the reactive species and is selected based in part upon shelf stability considerations (as described above). Suitable donors are generally capable of increasing the speed of cure or the image density of a photoreactive composition upon exposure to light of the desired wavelength.

When working with cationically-reactive species, those skilled in the art will recognize that the electron donor compound, if of significant basicity, can adversely affect the cationic reaction. (See, for example, the discussion in U.S. Pat. No. 6,025,406 (Oxman et al.) at column 7, line 62, through column 8, line 49.)

In general, electron donor compounds suitable for use with particular photosensitizers and photoinitiators can be selected by comparing the oxidation and reduction potentials of the three components (as described, for example, in U.S. Pat. No. 4,859,572 (Farid et al.)). Such potentials can be measured experimentally (for example, by the methods described by R. J. Cox, *Photograhpic Sensitivity*, Chapter 15, Academic Press (1973)) or can be obtained from references such as N. L. Weinburg, Ed., *Technique of Electroorganic Synthesis Part II Techniques of Chemistry*, Vol. V (1975), and C. K. Mann and K. K. Barnes, *Electrochemical Reactions in Nonaqueous Systems* (1970). The potentials reflect relative energy relationships and can be used in the following manner to guide electron donor compound selection:

When the photosensitizer is in an electronic excited state, an electron in the highest occupied molecular orbital (HOMO) of the photosensitizer has been lifted to a higher energy level (namely, the lowest unoccupied molecular orbital (LUMO) of the photosensitizer), and a vacancy is left behind in the molecular orbital it initially occupied. The photoinitiator can accept the electron from the higher energy orbital, and the electron donor compound can donate an electron to fill the vacancy in the originally occupied orbital, provided that certain relative energy relationships are satisfied.

If the reduction potential of the photoinitiator is less negative (or more positive) than that of the photosensitizer, an electron in the higher energy orbital of the photosensitizer is readily transferred from the photosensitizer to the lowest unoccupied molecular orbital (LUMO) of the photoinitiator, since this represents an exothermic process. Even if the process is instead slightly endothermic (that is, even if the reduction potential of the photosensitizer is up to 0.1 volt more negative than that of the photoinitiator) ambient thermal activation can readily overcome such a small barrier.

In an analogous manner, if the oxidation potential of the electron donor compound is less positive (or more negative) than that of the photosensitizer, an electron moving from the HOMO of the electron donor compound to the orbital vacancy in the photosensitizer is moving from a higher to a lower potential, which again represents an exothermic process. Even if the process is slightly endothermic (that is, even if the oxidation potential of the photosensitizer is up to 0.1 volt more positive than that of the electron donor compound), ambient thermal activation can readily overcome such a small barrier.

Slightly endothermic reactions in which the reduction potential of the photosensitizer is up to 0.1 volt more negative than that of the photoinitiator, or the oxidation potential of the photosensitizer is up to 0.1 volt more positive than that of the electron donor compound, occur in every instance, regardless of whether the photoinitiator or the electron donor compound first reacts with the photosensitizer in its excited state. When the photoinitiator or the electron donor compound is reacting with the photosensitizer in its excited state, it is preferred that the reaction be exothermic or only slightly endothermic. When the photoinitiator or the electron donor compound is reacting with the photosensitizer ion radical, exothermic reactions are still preferred, but still more endothermic reactions can be expected in many instances to occur. Thus, the reduction potential of the photosensitizer can be up to 0.2 volt (or more) more negative than that of a second-to-react photoinitiator, or the oxidation potential of the photosensitizer can be up to 0.2 volt (or more) more positive than that of a second-to-react electron donor compound.

Suitable electron donor compounds include, for example, those described by D. F. Eaton in *Advances in Photochemistry*, edited by B. Voman et al., Volume 13, pp. 427–488, John Wiley and Sons, New York (1986); by Oxman et al. in U.S. Pat. No. 6,025,406 at column 7, lines 42–61; and by Palazzotto et al. in U.S. Pat. No. 5,545,676 at column 4, line 14 through column 5, line 18. Such electron donor compounds include amines (including triethanolamine, hydrazine, 1,4-diazabicyclo[2.2.2]octane, triphenylamine (and its triphenylphosphine and triphenylarsine analogs), aminoaldehydes, and aminosilicones), amides (including phosphoramides), ethers (including thioethers), ureas (including thioureas), sulfinic acids and their salts, salts of ferrocyanide, ascorbic acid and its salts, dithiocarbamic acid and its salts, salts of xanthates, salts of ethylene diamine tetraacetic acid, salts of $(alkyl)_n(aryl)_m$ borates (n+m=4) (tetraalkylammonium salts preferred), various organometallic compounds such as $SnR_4$ compounds (where each R is independently chosen from among alkyl, aralkyl (particularly, benzyl), aryl, and alkaryl groups) (for example, such compounds as $n\text{-}C_3H_7Sn(CH_3)_3$, (allyl)$Sn(CH_3)_3$, and (benzyl)$Sn(n\text{-}C_3H_7)_3$), ferrocene, and the like, and mixtures thereof. The electron donor compound can be unsubstituted or can be substituted with one or more non-interfering substituents. Particularly preferred electron donor compounds contain an electron donor atom (such as a nitrogen, oxygen, phosphorus, or sulfur atom) and an abstractable hydrogen atom bonded to a carbon or silicon atom alpha to the electron donor atom.

Preferred amine electron donor compounds include alkyl-, aryl-, alkaryl- and aralkyl-amines (for example, methylamine, ethylamine, propylamine, butylamine, triethanolamine, amylamine, hexylamine, 2,4-dimethylaniline, 2,3-dimethylaniline, o-, m- and p-toluidine, benzylamine, aminopyridine, N,N'-dimethylethylenediamine, N,N'-diethylethylenediamine, N,N'-dibenzylethylenediamine, N,N'-diethyl-1,3-propanediamine, N,N'-diethyl-2-butene-1,4-diamine, N,N'-dimethyl-1,6-hexanediamine, piperazine, 4,4'-trimethylenedipiperidine, 4,4'-ethylenedipiperidine, p-N,N-dimethyl-aminophenethanol and p-N-dimethylaminobenzonitrile); aminoaldehydes (for example, p-N,N-dimethylaminobenzaldehyde, p-N,N-diethylaminobenzaldehyde, 9-julolidine carboxaldehyde, and 4-morpholinobenzaldehyde); and aminosilanes (for example, trimethylsilylmorpholine, trimethylsilylpiperidine, bis(dimethylamino)diphenylsilane, tris(dimethylamino)methylsilane, N,N-diethylaminotrimethylsilane, tris(dimethylamino)phenylsilane, tris(methylsilyl)amine, tris(dimethylsilyl)amine, bis(dimethylsilyl)amine, N,N-bis(dimethylsilyl)aniline, N-phenyl-N-dimethylsilylaniline, and N,N-dimethyl-N-dimethylsilylamine); and mixtures thereof. Tertiary aromatic alkylamines, particularly those having at least one electron-withdrawing group on the aromatic ring, have been found to provide especially good shelf stability. Good shelf stability has also been obtained using amines that are solids at room temperature. Good photographic speed has been obtained using amines that contain one or more julolidinyl moieties.

Preferred amide electron donor compounds include N,N-dimethylacetamide, N,N-diethylacetamide, N-methyl-N-phenylacetamide, hexamethylphosphoramide, hexaethylphosphoramide, hexapropylphosphoramide, trimorpholinophosphine oxide, tripiperidinophosphine oxide, and mixtures thereof.

Preferred alkylarylborate salts include

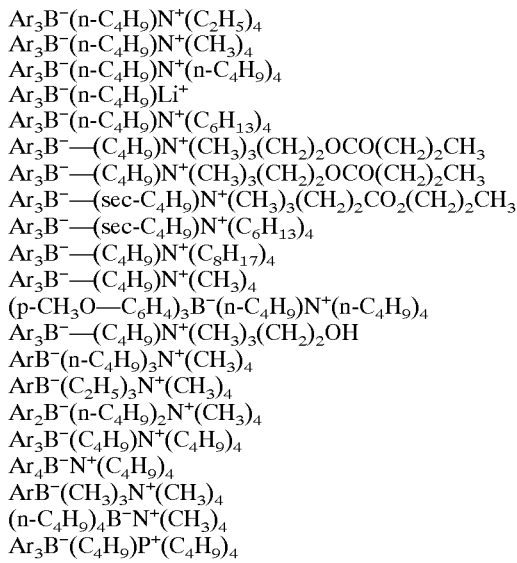

(where Ar is phenyl, naphthyl, substituted (preferably, fluoro-substituted) phenyl, substituted naphthyl, and like groups having greater numbers of fused aromatic rings), as well as tetramethylammonium n-butyltriphenylborate and tetrabutylammonium n-hexyl-tris(3-fluorophenyl)borate (available as CGI 437 and CGI 746 from Ciba Specialty Chemicals Corporation), and mixtures thereof.

Suitable ether electron donor compounds include 4,4'-dimethoxybiphenyl, 1,2,4-trimethoxybenzene, 1,2,4,5-tetramethoxybenzene, and the like, and mixtures thereof. Suitable urea electron donor compounds include N,N'-dimethylurea, N,N-dimethylurea, N,N'-diphenylurea, tetramethylthiourea, tetraethylthiourea, tetra-n-butylthiourea, N,N-di-n-butylthiourea, N,N'-di-n-butylthiourea, N,N-diphenylthiourea, N,N'-diphenyl-N,N'-diethylthiourea, and the like, and mixtures thereof.

Preferred electron donor compounds for free radical-induced reactions include amines that contain one or more julolidinyl moieties, alkylarylborate salts, and salts of aromatic sulfinic acids. However, for such reactions, the electron donor compound can also be omitted, if desired (for example, to improve the shelf stability of the photoreactive composition or to modify resolution, contrast, and reciprocity). Preferred electron donor compounds for acid-induced reactions include 4-dimethylaminobenzoic acid, ethyl 4-dimethylaminobenzoate, 3-dimethylaminobenzoic acid, 4-dimethylaminobenzoin, 4-dimethylaminobenzaldehyde, 4-dimethylaminobenzonitrile, 4-dimethylaminophenethyl alcohol, and 1,2,4-trimethoxybenzene.

(3) Photoinitiators

Suitable photoinitiators (that is, electron acceptor compounds) for the reactive species of the photoreactive compositions are those that are capable of being photosensitized by accepting an electron from an electronic excited state of the multiphoton photosensitizer, resulting in the formation of at least one free radical and/or acid. Such photoinitiators include iodonium salts (for example, diaryliodonium salts), chloromethylated triazines (for example, 2-methyl-4,6-bis(trichloromethyl)-s-triazine, 2,4,6-tris(trichloromethyl)-s-triazine, and 2-aryl-4,6-bis(trichloromethyl)-s-triazine), diazonium salts (for example, phenyldiazonium salts optionally substituted with groups such as alkyl, alkoxy, halo, or nitro), sulfonium salts (for example, triarylsulfonium salts optionally substituted with alkyl or alkoxy groups, and optionally having 2,2' oxy groups bridging adjacent aryl moieties), azinium salts (for example, an N-alkoxypyridinium salt), and triarylimidazolyl dimers (preferably, 2,4,5-triphenylimidazolyl dimers such as 2,2',4,4',5,5'-tetraphenyl-1,1'-biimidazole, optionally substituted with groups such as alkyl, alkoxy, or halo), and the like, and mixtures thereof.

The photoinitiator is preferably soluble in the reactive species and is preferably shelf-stable (that is, does not spontaneously promote reaction of the reactive species when dissolved therein in the presence of the photosensitizer and the electron donor compound). Accordingly, selection of a particular photoinitiator can depend to some extent upon the particular reactive species, photosensitizer, and electron donor compound chosen, as described above. If the reactive species is capable of undergoing an acid-initiated chemical reaction, then the photoinitiator is an onium salt (for example, an iodonium, sulfonium, or diazonium salt).

Suitable iodonium salts include those described by Palazzotto et al. in U.S. Pat. No. 5,545,676 at column 2, lines 28 through 46. Suitable iodonium salts are also described in U.S. Pat. Nos. 3,729,313, 3,741,769, 3,808,006, 4,250,053 and 4,394,403. The iodonium salt can be a simple salt (for example, containing an anion such as Cl$^-$, Br$^-$, I$^-$ or C$_4$H$_5$SO$_3^-$) or a metal complex salt (for example, containing SbF$_6^-$, PF$_6^-$, BF$_4^-$, tetrakis(perfluorophenyl)borate, SbF$_5$OH$^-$ or AsF$_6^-$). Mixtures of iodonium salts can be used if desired.

Examples of useful aromatic iodonium complex salt photoinitiators include diphenyliodonium tetrafluoroborate; di(4-methylphenyl)iodonium tetrafluoroborate; phenyl-4-methylphenyliodonium tetrafluoroborate; di(4-heptylphenyl)iodonium tetrafluoroborate; di(3-nitrophenyl)iodonium hexafluorophosphate; di(4-chlorophenyl)iodonium hexafluorophosphate; di(naphthyl)iodonium tetrafluoroborate; di(4-trifluoromethylphenyl)iodonium tetrafluoroborate; diphenyliodonium hexafluorophosphate; di(4-methylphenyl)iodonium hexafluorophosphate; diphenyliodonium hexafluoroarsenate; di(4-phenoxyphenyl)iodonium tetrafluoroborate; phenyl-2-thienyliodonium hexafluorophosphate; 3,5-dimethylpyrazolyl-4-phenyliodonium hexafluorophosphate; diphenyliodonium hexafluoroantimonate; 2,2'-diphenyliodonium tetrafluoroborate; di(2,4-dichlorophenyl)iodonium hexafluorophosphate; di(4-bromophenyl)iodonium hexafluorophosphate; di(4-methoxyphenyl)iodonium hexafluorophosphate; di(3-carboxyphenyl)iodonium hexafluorophosphate; di(3-methoxycarbonylphenyl)iodonium hexafluorophosphate; di(3-methoxysulfonylphenyl)iodonium hexafluorophosphate; di(4-acetamidophenyl)iodonium hexafluorophosphate; di(2-benzothienyl)iodonium hexafluorophosphate; and diphenyliodonium hexafluoroantimonate; and the like;

and mixtures thereof. Aromatic iodonium complex salts can be prepared by metathesis of corresponding aromatic iodonium simple salts (such as, for example, diphenyliodonium bisulfate) in accordance with the teachings of Beringer et al., J. Am. Chem. Soc. 81, 342 (1959).

Preferred iodonium salts include diphenyliodonium salts (such as diphenyliodonium chloride, diphenyliodonium hexafluorophosphate, and diphenyliodonium tetrafluoroborate), diaryliodonium hexafluoroantimonate (for example, SarCat™ SR 1012 available from Sartomer Company), and mixtures thereof.

Useful chloromethylated triazines include those described in U.S. Pat. No. 3,779,778 (Smith et al.) at column 8, lines 45–50, which include 2,4-bis(trichloromethyl)-6-methyl-s-triazine, 2,4,6-tris(trichloromethyl)-s-triazine, and the more preferred chromophore-substituted vinylhalomethyl-s-triazines disclosed in U.S. Pat. Nos. 3,987,037 and 3,954,475 (Bonham et al.).

Useful diazonium salts include those described in U.S. Pat. No. 4,394,433 (Gatzke), which comprise a light sensitive aromatic moiety (for example, pyrrolidine, morpholine, aniline, and diphenyl amine) with an external diazonium group (–N$^+$=N) and an anion (for example, chloride, tri-isopropyl naphthalene sulfonate, tetrafluoroborate, and the bis(perfluoroalkylsulfonyl)methides) associated therewith. Examples of useful diazonium cations include 1-diazo-4-anilinobenzene, N-(4-diazo-2,4-dimethoxy phenyl) pyrrolidine, 1-diazo-2,4-diethoxy-4-morpholino benzene, 1-diazo-4-benzoyl amino-2,5-diethoxy benzene, 4-diazo-2,5-dibutoxy phenyl morpholino, 4-diazo-1-dimethyl aniline, 1-diazo-N,N-dimethylaniline, 1-diazo-4-N-methyl-N-hydroxyethyl aniline, and the like.

Useful sulfonium salts include those described in U.S. Pat. No. 4,250,053 (Smith) at column 1, line 66, through column 4, line 2, which can be represented by the formulas:

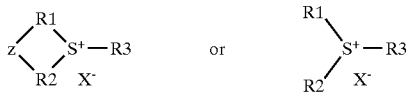

wherein $R_1$, $R_2$, and $R_3$ are each independently selected from aromatic groups having from about 4 to about 20 carbon atoms (for example, substituted or unsubstituted phenyl, naphthyl, thienyl, and furanyl, where substitution can be with such groups as alkoxy, alkylthio, arylthio, halogen, and so forth) and alkyl groups having from 1 to about 20 carbon atoms. As used here, the term "alkyl" includes substituted alkyl (for example, substituted with such groups as halogen, hydroxy, alkoxy, or aryl). At least one of $R_1$, $R_2$, and $R_3$ is aromatic, and, preferably, each is independently aromatic. Z is selected from the group consisting of a covalent bond, oxygen, sulfur, —S(=O)—, —C(=O)—, —(O=)S(=O)—, and —N(R)—, where R is aryl (of about 6 to about 20 carbons, such as phenyl), acyl (of about 2 to about 20 carbons, such as acetyl, benzoyl, and so forth), a carbon-to-carbon bond, or —(R$_4$—)C(—R$_5$)—, where $R_4$ and $R_5$ are independently selected from the group consisting of hydrogen, alkyl groups having from 1 to about 4 carbon atoms, and alkenyl groups having from about 2 to about 4 carbon atoms. X$^-$ is an anion, as described below.

Suitable anions, X$^-$, for the sulfonium salts (and for any of the other types of photoinitiators) include a variety of anion types such as, for example, imide, methide, boron-centered, phosphorous-centered, antimony-centered, arsenic-centered, and aluminum-centered anions.

Illustrative, but not limiting, examples of suitable imide and methide anions include $(C_2F_5SO_2)_2N^-$, $(C_4F_9SO_2)_2N^-$, $(C_8F_{17}SO_2)_3C^-$, $(CF_3SO_2)_3C^-$, $(CF_3SO_2)_2N^-$, $(C_4F_9SO_2)_3C^-$, $(CF_3SO_2)_2(C_4F_9SO_2)C^-(CF_3SO_2)$ $(C_4F_9SO_2)N^-$, $((CF_3)_2NC_2F_4SO_2)_2N^-$, $(CF_3)_2NC_2F_4SO_2C^-$ $(SO_2 CF_3)_2$, $(3,5\text{-bis}(CF_3)C_6H_3)SO_2N^-SO_2CF_3$, $C_6H_5SO_2C^-(SO_2CF_3)_2$, $C_6H_5SO_2N^-SO_2CF_3$, and the like. Preferred anions of this type include those represented by the formula $(R_fSO_2)_3C^-$, wherein $R_f$ is a perfluoroalkyl radical having from 1 to about 4 carbon atoms.

Illustrative, but not limiting, examples of suitable boron-centered anions include $F_4B^-$, $(3,5\text{-bis}(CF_3)C_6H_3)_4B^-$, $(C_6F_5)_4B^-$, $(p\text{-}CF_3C_6H_4)_4B^-$, $(m\text{-}CF_3C_6H_4)_4B^-$, $(p\text{-}FC_6H_4)_4B^-$, $(C_6F_5)_3(CH_3)B^-$, $(C_6F_5)_3(n\text{-}C_4H_9)B^-$, $(p\text{-}CH_3C_6H_4)_3(C_6F_5)B^-$, $(C_6F_5)_3FB^-$, $(C_6H_5)_3(C_6F_5)B^-$, $(CH_3)_2(p\text{-}CF_3C_6H_4)_2B^-$, $(C_6F_5)_3(n\text{-}C_{18}H_{37}O)B^-$, and the like. Preferred boron-centered anions generally contain 3 or more halogen-substituted aromatic hydrocarbon radicals attached to boron, with fluorine being the most preferred halogen. Illustrative, but not limiting, examples of the preferred anions include $(3,5\text{-bis}(CF_3)C_6H_3)_4B^-$, $(C_6F_5)_4B^-$, $(C_6F_5)_3(n\text{-}C_4H_9)B^-$, $(C_6F_5)_3FB^-$, and $(C_6F_5)_3(CH_3)B^-$.

Suitable anions containing other metal or metalloid centers include, for example, $(3,5\text{-bis}(CF_3)C_6H_3)_4Al^-$, $(C_6F_5)_4Al^-$, $(C_6F_5)_2F_4P^-$, $(C_6F_5)F_5P^-$, $F_6P^-$, $(C_6F_5)F_5Sb^-$, $F_6Sb^-$, $(HO)F_5Sb^-$, and $F_6As^-$. The foregoing lists are not intended to be exhaustive, as other useful boron-centered nonnucleophilic salts, as well as other useful anions containing other metals or metalloids, will be readily apparent (from the foregoing general formulas) to those skilled in the art.

Preferably, the anion, X$^-$, is selected from tetrafluoroborate, hexafluorophosphate, hexafluoroarsenate, hexafluoroantimonate, and hydroxypentafluoroantimonate (for example, for use with cationically-reactive species such as epoxy resins).

Examples of suitable sulfonium salt photoinitiators include:

triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
diphenylnaphthylsulfonium hexafluoroarsenate
tritolysulfonium hexafluorophosphate
anisyldiphenylsulfonium hexafluoroantimonate
4-butoxyphenyldiphenylsulfonium tetrafluoroborate
4-chlorophenyldiphenylsulfonium hexafluorophosphate
tri(4-phenoxyphenyl)sulfonium hexafluorophosphate
di(4-ethoxyphenyl)methylsulfonium hexafluoroarsenate
4-acetonylphenyldiphenylsulfonium tetrafluoroborate
4-thiomethoxyphenyldiphenylsulfonium hexafluorophosphate
di(methoxysulfonylphenyl)methylsulfonium hexafluoroantimonate
di(nitrophenyl)phenylsulfonium hexafluoroantimonate
di(carbomethoxyphenyl)methylsulfonium hexafluorophosphate
4-acetamidophenyldiphenylsulfonium tetrafluoroborate
dimethylnaphthylsulfonium hexafluorophosphate
trifluoromethyldiphenylsulfonium tetrafluoroborate
p-(phenylthiophenyl)diphenylsulfonium hexafluoroantimonate
10-methylphenoxathiinium hexafluorophosphate
5-methylthianthrenium hexafluorophosphate
10-phenyl-9,9-dimethylthioxantheniun hexafluorophosphate 10-phenyl-9-oxothioxanthenium tetrafluoroborate
5-methyl-10-oxothianthrenium tetrafluoroborate
5-methyl-10,10-dioxothianthrenium hexafluorophosphate Preferred sulfonium salts include triaryl-substituted salts such as triarylsulfonium hexafluoroantimonate (for example, SarCat™ SR1010 available from Sartomer Company), triarylsulfonium hexafluorophosphate (for example, SarCat™ SR 1011 available from Sartomer Company), and triarylsulfonium hexafluorophosphate (for example, SarCat™ KI85 available from Sartomer Company).

Useful azinium salts include those described in U.S. Pat. No. 4,859,572 (Farid et al.) at column 8, line 51, through column 9, line 46, which include an azinium moiety, such as a pyridinium, diazinium, or triazinium moiety. The azinium moiety can include one or more aromatic rings, typically carbocyclic aromatic rings (for example, quinolinium, isoquinolinium, benzodiazinium, and naphthodiazonium moieties), fused with an azinium ring. A quaternizing substituent of a nitrogen atom in the azinium ring can be released as a free radical upon electron transfer from the electronic excited state of the photosensitizer to the azinium photoinitiator. In one preferred form, the quaternizing substituent is an oxy substituent. The oxy substituent, —O—T, which quaternizes a ring nitrogen atom of the azinium moiety can be selected from among a variety of synthetically convenient oxy substituents. The moiety T can, for example, be an alkyl radical, such as methyl, ethyl, butyl, and so forth. The alkyl radical can be substituted. For example, aralkyl (for example, benzyl and phenethyl) and sulfoalkyl (for example, sulfomethyl) radicals can be useful. In another form, T can be an acyl radical, such as an —OC(O)—T$^1$ radical, where T$^1$ can be any of the various alkyl and aralkyl radicals described above. In addition, T$^1$ can be an aryl radical, such as phenyl or naphthyl. The aryl radical can in turn be substituted. For example, T$^1$ can be a tolyl or xylyl radical. T typically contains from 1 to about 18 carbon atoms, with alkyl moieties in each instance above preferably being lower alkyl moieties and aryl moieties in each instance preferably containing about 6 to about 10 carbon atoms. Highest activity levels have been realized when the oxy substituent, —O—T, contains 1 or 2 carbon atoms. The azinium nuclei need include no substituent other than the quaternizing substituent. However, the presence of other substituents is not detrimental to the activity of these photoinitiators.

Useful triarylimidazolyl dimers include those described in U.S. Pat. No. 4,963,471 (Trout et al.) at column 8, lines 18–28. These dimers include, for example, 2-(o-chlorophenyl)-4,5-bis(m-methoxyphenyl)-1,1'-biimidazole; 2,2'-bis(o-chlorophenyl)-4,4',5,5'-tetraphenyl-1,1'-biimidazole; and 2,5-bis(o-chlorophenyl)-4-[3,4-dimethoxyphenyl]-1,1'-biimidazole.

Preferred photoinitiators include iodonium salts (more preferably, aryliodonium salts), chloromethylated triazines, triarylimidazolyl dimers (more preferably, 2,4,5-triphenylimidazolyl dimers), sulfonium salts, and diazonium salts. More preferred are aryliodonium salts, chloromethylated triazines, and the 2,4,5-triphenylimidazolyl dimers (with aryliodonium salts and the triazines being most preferred).

Preparation of Photoreactive Composition

The reactive species, multiphoton photosensitizers, electron donor compounds, and photoinitiators can be prepared by the methods described above or by other methods known in the art, and many are commercially available. These four components can be combined under "safe light" conditions using any order and manner of combination (optionally, with stirring or agitation), although it is sometimes preferable (from a shelf life and thermal stability standpoint) to add the photoinitiator last (and after any heating step that is optionally used to facilitate dissolution of other components). Solvent can be used, if desired, provided that the solvent is chosen so as to not/react appreciably with the components of the composition. Suitable solvents include, for example, acetone, dichloromethane, and acetonitrile. The reactive species itself can also sometimes serve as a solvent for the other components.

The three components of the photoinitiator system are present in photochemically effective amounts (as defined above). Generally, the composition can contain at least about 5% (preferably, at least about 10%; more preferably, at least about 20%) up to about 99.79% (preferably, up to about 95%; more preferably, up to about 80%) by weight of one or more reactive species; at least about 0.01% (preferably, at least about 0.1%; more preferably, at least about 0.2%) up to about 10% (preferably, up to about 5%; more preferably, up to about 2%) by weight of one or more photosensitizers; optionally, up to about 10% (preferably, up to about 5%) by weight of one or more electron donor compounds (preferably, at least about 0.1%; more preferably, from about 0.1% to about 5%); and from about 0.1% to about 10% by weight of one or more electron acceptor compounds (preferably, from about 0.1% to about 5%) based upon the total weight of solids (that is, the total weight of components other than solvent). When the reactive species is a leuco dye, the composition generally can contain from about 0.01% to about 10% by weight of one or more reactive species (preferably, from about 0.3% to about 10%; more preferably, from about 1% to about 10%; most preferably, from about 2% to about 10%).

A wide variety of adjuvants can be included in the photoreactive compositions, depending upon the desired end use. Suitable adjuvants include solvents, diluents, resins, binders, plasticizers, pigments, dyes, inorganic or organic reinforcing or extending fillers (at preferred amounts of about 10% to 90% by weight based on the total weight of the composition), thixotropic agents, indicators, inhibitors, stabilizers, ultraviolet absorbers, medicaments (for example, leachable fluorides), and the like. The amounts and types of such adjuvants and their manner of addition to the compositions will be familiar to those skilled in the art.

It is within the scope of this invention to include nonreactive polymeric binders in the compositions in order, for example, to control viscosity and to provide film-forming properties. Such polymeric binders can generally be chosen to be compatible with the reactive species. For example, polymeric binders that are soluble in the same solvent that is used for the reactive species, and that are free of functional groups that can adversely affect the course of reaction of the reactive species, can be utilized. Binders can be of a molecular weight suitable to achieve desired film-forming properties and solution rheology (for example, molecular weights between about 5,000 and 1,000,000 daltons; preferably between about 10,000 and 500,000 daltons; more preferably, between about 15,000 and 250,000 daltons). Suitable polymeric binders include, for example, polystyrene, poly(methyl methacrylate), poly(styrene)-co-(acrylonitrile), cellulose acetate butyrate, and the like.

Prior to exposure, the resulting photoreactive compositions can be coated on a substrate, if desired, by any of a variety of coating methods known to those skilled in the art (including, for example, knife coating and spin coating). The substrate can be chosen from a wide variety of films, sheets, and other surfaces, depending upon the particular application and the method of exposure to be utilized. Preferred substrates are generally sufficiently flat to enable the preparation of a layer of photoreactive composition having a uniform thickness. For applications where coating is less desirable, the photoreactive compositions can alternatively be exposed in bulk form.

Exposure System and Its Use

Useful exposure systems include at least one light source (usually a pulsed laser) and at least one optical element. Suitable light sources include, for example, femtosecond near-infrared titanium sapphire oscillators (for example, a Coherent Mira Optima 900-F) pumped by an argon ion laser (for example, a Coherent Innova). This laser, operating at 76 MHz, has a pulse width of less than 200 femtoseconds, is tunable between 700 and 980 nm, and has average power up to 1.4 Watts. However, in practice, any light source that provides sufficient intensity (to effect multiphoton absorption) at a wavelength appropriate for the photosensitizer (used in the photoreactive composition) can be utilized. (Such wavelengths can generally be in the range of about 300 to about 1500 nm; preferably, from about 600 to about 1100 nm; more preferably, from about 750 to about 850 nm. Peak intensities can generally range from at least about $10^6$ W/cm$^2$. The upper limit of the pulse fluence is generally dictated by the ablation threshold of the photoreactive composition.) For example, Q-switched Nd:YAG lasers (for example, a Spectra-Physics Quanta-Ray PRO), visible wavelength dye lasers (for example, a Spectra-Physics Sirah pumped by a Spectra-Physics Quanta-Ray PRO), and Q-switched diode pumped lasers (for example, a Spectra-Physics FCbar™) can also be utilized. Preferred light sources are near infrared pulsed lasers having a pulse length less than about $10^{-8}$ second (more preferably, less than about $10^{-9}$ second; most preferably, less than about $10^{-11}$ second). Other pulse lengths can be used provided that the above-detailed peak intensity and pulse fluence criteria are met.

Optical elements useful in carrying out the method of the invention include refractive optical elements (for example, lenses and prisms), reflective optical elements (for example, retroreflectors or focusing mirrors), diffractive optical elements (for example, gratings, phase masks, and holograms), polarizing optical elements (for example, linear polarizers and waveplates), diffusers, Pockels cells, waveguides, waveplates, and birefringent liquid crystals, and the like. Such optical elements are useful for focusing, beam delivery, beam/mode shaping, pulse shaping, and pulse timing. Generally, combinations of optical elements can be utilized, and other appropriate combinations will be recognized by those skilled in the art. It is often desirable to use optics with large numerical aperture to provide highly-focused light. However, any combination of optical elements that provides a desired intensity profile (and spatial placement thereof) can be utilized. For example, the exposure system can include a scanning confocal microscope (BioRad MRC600) equipped with a 0.75 NA objective (Zeiss 20X Fluar).

Generally, exposure of the photoreactive composition can be carried out using a light source (as described above) along with an optical system as a means for controlling the three-dimensional spatial distribution of light intensity within the composition. For example, the light from a pulsed laser can be passed through a focusing lens in a manner such that the focal point is within the volume of the composition. The focal point can be scanned or translated in a three-dimensional pattern that corresponds to a desired shape, thereby creating a three-dimensional image of the desired shape. The exposed or illuminated volume of the composition can be scanned either by moving the composition itself or by moving the light source (for example, moving a laser beam using galvo-mirrors).

If the light induces, for example, a reaction of the reactive species that produces a material having solubility characteristics different from those of the reactive species, the resulting image can optionally be developed by removing either the exposed or the unexposed regions through use of an appropriate solvent, for example, or by other art-known means. Cured, complex, three-dimensional objects can be prepared in this manner.

Exposure times generally depend upon the type of exposure system used to cause image formation (and its accompanying variables such as numerical aperture, geometry of light intensity spatial distribution, the peak light intensity during the laser pulse (higher intensity and shorter pulse duration roughly correspond to peak light intensity)), as well as upon the nature of the composition exposed (and its concentrations of photosensitizer, photoinitiator, and electron donor compound). Generally, higher peak light intensity in the regions of focus allows shorter exposure times, everything else being equal. Linear imaging or "writing" speeds generally can be about 5 to 100,000 microns/second using a laser pulse duration of about $10^{-8}$ to $10^{-15}$ second (preferably, about $10^{-11}$ to $10^{-14}$ second) and about $10^2$ to $10^9$ pulses per second (preferably, about $10^3$ to $10^8$ pulses per second).

EXAMPLES

Objects and advantages of this invention are further illustrated by the following examples, but the particular materials and amounts thereof recited in these examples, as well as other conditions and details, should not be construed to unduly limit this invention.

Glossary

PSAN—poly(styrene-co-acrylonitrile) with weight average molecular weight of about 165,000, and 25 weight % acrylonitrile, available from Aldrich, Milwaukee, Wis.

SR-9008—alkoxylated trifunctional acrylate ester, available from Sartomer Co., Exton, Pa.

SR-368—tris(2-hydroxyethyl)isocyanurate triacrylate, available from Sartomer Co., Exton, Pa.

DPI PF$_6$—can be made essentially as described in column 4 of U.S. Pat. No. 4,394,403 (Smith), using silver hexafluorophosphate.

EDMAB—ethyl 4-dimethylaminobenzoate, available from Aldrich, Milwaukee, Wis.

TMSPMA—3-(trimethoxysilyl)propyl methacrylate, available from Aldrich, Milwaukee, Wis.

DIDMA —N-(2,6-diisopropyl)-N,N-dimethylaniline, available from Aldrich, Milwaukee, Wis.

CGI 7460—tetrabutylammonium n-hexyl-tris(3-fluorophenyl)borate, available from CIBA Specialty Chemicals Corp., Tarrytown, N.Y.

H—Nu 470—5,7-diiodo-3-butoxy-6-fluorone, available from Spectra Group, Ltd., Maumee, Ohio.

Rhodamine B—N-[9-(2-carboxyphenyl)-6-(diethylamino)-3H-xanthen-3-ylidene]-N-ethylethanaminium chloride, available from Aldrich, Milwaukee, Wis.

Epon™ SU-8 —bisphenol A novalac epoxy resin, also known as Epicote™ 157, available from Resolution Performance Products, Houston, Tex.

CD-1012—4-(2-hydroxytetradecanoxy)phenylphenyl iodonium hexafluoroantimonate, available from Sartomer Co., Exton, Pa.

TMB—1,2,4-trimethoxybenzene, available from Aldrich, Milwaukee, Wis.

DPI SbF$_6$—can be made essentially as described in column 4 of U.S. Pat. No. 4,394,403 (Smith), using silver hexafluoroantimonate.

PMMA—120,000 molecular weight poly(methyl methacrylate), available from Aldrich, Milwauke, Wis.

Hydroxy Cyan Leuco Dye—3',5'di-tert-butyl-4'-hydroxybenzoyl-3,7-di(N,N-diethylamino)oxazine, which can be prepared as in Example 1 of U.S. Pat. No. 4,775,754 (Vogel et al).

CAB-551-1—cellulose acetate butyrate, available from Eastman Chemicals, Kingsport, Tenn.

Preparation of Multiphoton Photosensitizer I (MPS I)

Reaction of 1,4-bis(bromomethyl)-2,5-diethoxybenzene with triethyl phosphate 1,4-Bis(bromomethyl)-2,5-dimethoxybenzene was prepared essentially according to the literature procedure (Syper et al, Tetrahedron, 39, 781–792, 1983). The 1,4-bis(bromomethyl)-2,5-dimethoxybenzene (253 g, 0.78 mol) was placed into a 1000 mL round bottom flask. Triethyl phosphite (300 g, 2.10 mol) was added, and the reaction was heated to vigorous reflux with stirring for 48 hours under nitrogen atmosphere. The reaction mixture was cooled and the excess triethyl phosphite was removed under vacuum using a Kugelrohr apparatus. Upon heating to 100° C. at 0.1 mm Hg, a clear oil resulted. Upon cooling, the desired product solidified and was suitable for use directly in the next step. The $^1$H NMR spectrum of the product was consistent with the desired product. Recrystallization from toluene yielded colorless needles.

Synthesis of 1,4-bis-[4-(diphenylamino)styryl]-2,5-(dimethoxy)benzene (MPS I)

A 1000 mL round bottom flask was fitted with a calibrated dropping funnel and a magnetic stirrer. The flask was charged with the product prepared from the above reaction (19.8 g, 45.2 mmol) and N,N-diphenylamino-p-benzaldehyde (25 g, 91.5 mmol available from Fluka Chemical Corp., Milwaukee, Wis.). The flask was flushed with nitrogen and sealed with septa Anhydrous tetrahydrofuran (750 mL) was cannulated into the flask and all solids dissolved. The dropping funnel was charged with potassium tertiary butoxide (125 mL, 1.0 M in THF). The solution in the flask was stirred, and the potassium tertiary butoxide solution was added to the contents of the flask over the course of 30 minutes. The solution was then left to stir at ambient temperature overnight. The reaction was then quenched by the addition of water (500 mL). Stirring was continued, and after about 30 minutes a highly fluorescent yellow solid had formed in the flask. The solid was isolated by filtration, air-dried, and then recrystallized from toluene (450 mL). The desired product (MPS I) was obtained as fluorescent needles (24.7 g, 81% yield). The $^1$H NMR spectrum of the product was consistent with the proposed structure.

Examples 1–2

A stock solution was prepared by adding 30 g PSAN to 120 g dioxane, and mixing overnight on a roller. A second solution was prepared by adding 1 g of MPS I to 35 g SR-9008, then heating and stirring to partially dissolve the photosensitizer. The second solution was added to the stock solution and allowed to mix overnight on a roller. To this solution was added 35 g SR-368 and the solution allowed to mix overnight on a roller, providing masterbatch A. In two separate vials, 11 g of masterbatch A was placed. 0.1 g DPI PF6 was dissolved in 1 ml of acetonitrile and added to the first vial containing 11 g of masterbatch A and the resulting solution mixed by agitation and then used in Example 1. 0.1 g DPI PF6 and 0.1 g EDMAB were dissolved in 1 ml of acetonitrile and added to the second vial containing 11 g masterbatch A, and the resulting solution used in Example 2.

Two milliliters of each of the two solutions prepared above were filtered through a 0.45 μm syringe filter and coated with a spin coater onto silicon wafers (that had been previously treated with TMSPMA) at 3000 RPM for 40 sec, and baked at 80° C. for 40 min to remove solvent.

The resulting coated films were patterned by focusing the output of a Spectra-Physics Ti-sapphire laser (100 fs pulses, 80 MHz, 800 nm) (laser available from Spectra-Physics, Mountain View. Calif. as part of "Hurricane" system), using a 10×, 0.25 NA (numeric aperture) microscope objective, into the film and moving the film mounted on a computer controlled, motorized X-Y stage (NEAT LM-600 stage, available from New England Affiliated Technologies, Lawrence, Mass.). Based on gaussian optics formulae, the diameter of the focussed spot was approximately 8 μm. The average laser power was measured using an Ophir calibrated photodiode (available from Ophir Optronics Inc., Danvers, Mass.). To assess the photosensitivity of different formulations, a pattern of lines was produced where for each line the speed of the stage was increased by a factor of √2 to cover a range from 77 to 27520 μm/sec. Following imaging, the patterns were developed by dipping in dimethylformamide for one minute, rinsing in isopropyl alcohol and air drying.

Table 1 summarizes the threshold writing speed for Examples 1 and 2. Threshold writing speed corresponded to the last line visible in the pattern when examined using an optical microscope.

TABLE 1

Threshold Writing Speed of Two- and Three-Component Photoinitiator Systems in Acrylate Resin.

| Example Number | Photopolymer Formulation | Photoinitiator System (% by weight of resin solids) | Threshold Writing Speed (17 mW) | Threshold Writing Speed (33 mW) |
|---|---|---|---|---|
| 1 | PSAN, SR-9008, SR-368 | MPS I (1%), DPI PF6 (2%) | 1742 μm/sec | 3440 μm/sec |
| 2 | PSAN, SR9008, SR368 | MPS I (1%), DPI PF6 (2%), EDMAB (2%) | 1742 μm/sec | 4960 μm/sec |

The results in Table 1 show high writing speeds, and a particularly high writing speed at the higher laser intensity when the electron donor compound, EDMAB, was used with the photosensitizer and photoinitiator.

Examples 3–6 and Comparative Example C1

A stock solution was prepared by adding 30 g PMMA to 120 g dioxane, and mixing overnight on a roller. A second solution was prepared by adding 1 g of MPS I to 35 g Sartomer™ SR9008, then heating and stirring to partially dissolve the photosensitizer. The second solution was added to the stock solution and allowed to mix overnight on a roller. To this solution was added 35 g Sartomer™ SR368 and the solution allowed to mix overnight on a roller, providing masterbatch B. In five separate vials, 11 g of masterbatch B was placed. 1 ml acetonitrile was added to the first vial containing 11 g of masterbatch B and the solution mixed by agitation (Comparative Example C1). 0.1 g DPI PF6 was dissolved in 1ml of acetonitrile and added to the second vial containing 11 g of masterbatch B and the solution mixed by agitation (Example 3). 0.1 g DPI PF6 and 0.1 g EDMAB was dissolved in acetonitrile and added to the third vial containing 11 g masterbatch B and the solution mixed by agitation (Example 4). 0.1 g DPI PF6 and 0.1 g DIDMA was dissolved in acetonitrile and added to the third vial containing 11 g masterbatch B and the solution mixed by agitation (Example 5). 0.1 g DPI PF6 and 0.1 g CGI 7460 (alkyltriarylborate salt) was dissolved in 1 ml of acetonitrile and added to the fourth vial containing 11 g of masterbatch B and the solution mixed by agitation (Example 6).

Two milliliters of each of the five solutions prepared above were filtered through a 0.45 µm syringe filter and coated with a spin coater onto silicon wafers (that had been previously treated with TMSPMA) at 3000 RPM for 40 sec, and baked at 80° C. for 40 min to remove solvent.

The coated films were patterned essentially as in Example 1 by focusing the output of a Spectra-Physics Ti-sapphire laser (100 fs pulses, 80 MHz, 800 nm) using a 10×, 0.25 NA microscope objective into the film and moving the film mounted on a NEAT LM-600 computer controlled, motorized X-Y stage. Based on gaussian optics formulae, the diameter of the focussed spot is approximately 8 um. The average laser power was measured as the beam exited the objective using an Ophir calibrated photodiode. To assess the photosensitivity of different formulations, a pattern of lines was produced where for each line, the speed of the stage was increased by a factor of $\sqrt{2}$ to cover a range from 77 to 27520 µm/s. Following imaging, the patterns were developed by dipping the patterned films in dimethylformamide for one minute, rinsing in isopropyl alcohol, and air dry. The threshold writing speed was defined as the last line visible in the pattern when examined using an optical microscope.

Table 2 summarizes the threshold writing speeds for Examples 3–6 and Comparative Example C1 with two different laser intensities. The threshold writing speed when photosensitizer was used alone was 430 µm/s with 75 mW average laser power.

TABLE 2

Threshold Writing Speed of One-, Two- and Three-Component Systems in Acrylate Resin.

| Example Number | Photo-polymer Formulation | Photoinitiator System (% by weight of resin solids) | Threshold Writing Speed (17 mW) | Threshold Writing Speed (33 mW) |
|---|---|---|---|---|
| C1 | PMMA, SR9008, SR368 | MPS I (1%) | <<77 µm/s | 55 µm/s |
| 3 | PMMA, SR9008, SR368 | MPS I (1%), DPI PF6 (2%) | 1480 µm/s | 4960 µm/s |
| 4 | PMMA, SR9008, SR368 | MPS I (1%), DPI PF6 (2%), EDMAB (2%) | 1720 µm/s | 4960 µm/s |
| 5 | PMMA, SR9008, SR368 | MPS I (1%), DPI PF6 (2%), DIDMA (2%) | 1720 µm/s | 3440 µm/s |
| 6 | PMMA, SR9008, SR368 | MPS I (1%), DPI PF6 (2%), CGI 7460 (2%) | 3440 µm/s | 13760 µm/s |

The results in Table 2 show that high writing speeds were achieved when the two- and three-component photoinitiator systems were used, and a particularly high writing speed was achieved at the higher laser intensity when the electron donor compound, EDMAB, was used with the photosensitizer and photoinitiator.

Example 7

Coated films were prepared and patterned essentially as in Example 6 at 4, 6, 11, 17 and 30 mW average laser power, and threshold writing speeds were determined essentially as in Examples 3–6. The threshold writing speed scaled quadratically with the average power, as shown in FIG. 1, consistent with a two-photon induced photopolymerization.

Comparative Examples C9–C12

(Use of Fluorone Photosensitizer)

A stock solution was prepared by adding 30 g PMMA to 120 g dioxane, and mixing overnight on a roller. A second solution was prepared by adding 1 g of H—Nu 470 (photosensitizer) to 35 g Sartomer™ SR9008, then heating and stirring to partially dissolve the photosensitizer. The second solution was added to the stock solution and allowed to mix overnight on a roller. To the resulting solution was added 35 g Sartomer™ SR368, and the solution was allowed to mix overnight on a roller, providing masterbatch B. Masterbatch B (1 g) was mixed with 10 g of the above stock solution, and 0.025 g DPI PF6 and 0.025 g DIDMA were added and mixed with agitation (Comparative Example C2). In three separate vials, 11 g of masterbatch B was placed. 0.1 g DIDMA was dissolved in 1 ml of acetonitrile and added to the first vial containing 11 g of masterbatch B with mixing by agitation (Comparative Example C3). 0.1 g DPI PF6 was dissolved in 1 ml acetonitrile and added to the second vial containing 11 g masterbatch B with mixing by agitation (Comparative Example C4). 0.1 g DPI PF6 and 0.1 DIDMA were dissolved in 1 ml of acetonitrile and added to the third vial containing 11 g of masterbatch B with mixing by agitation (Comparative Example C5).

Two milliliters of each of the four resulting solutions prepared above were filtered through a 0.45 µm syringe filter and coated with a spin coater onto silicon wafers (that had been previously treated with TMSPMA) at 3000 RPM for 40 sec, and baked at 80° C. for 40 min to remove solvent.

The coated films were patterned essentially as in Example 1 by focusing the output of a Spectra-Physics Ti-sapphire laser (100 fs pulses, 80 MHz, 800 nm), using a 10×, 0.25 NA microscope objective, into the film and moving the film mounted on a on a NEAT LM-600 computer controlled, motorized X-Y stage. Based on gaussian optics formulae, the diameter of the focussed spot was approximately 8 um. The average laser power was measured as the beam exited the objective using an Ophir calibrated photodiode. To assess the photosensitivity of different formulations, a pattern of lines was produced where for each line, the speed of the stage was increased by a factor of $\sqrt{2}$ to cover a range from 77 to 27520 µm/s. Following imaging, the patterns were developed by dipping the patterned films in dimethylformamide for one minute, rinsing in isopropyl alcohol, and air drying. The threshold writing speed was defined as the last line visible in the pattern when examined using an optical microscope.

Table 3 summarizes the threshold writing speeds for Comparative Examples C2–C5 with two different laser intensities.

TABLE 3

Threshold Writing Speeds for Compositions Comprising Fluorone Photosensitizer.

| Comparative Example Number | Photo-polymer Formulation | Photo-initiator System (% by weight of resin solids) | Threshold Writing Speed (250 mW) | Threshold Writing Speed (331 mW) |
|---|---|---|---|---|
| C2 | PMMA, SR9008, SR368 | H-Nu 470 (0.18%), DIDMA (1%), DPI PF6 (1%) | 0 µm/s | 0 µm/s |
| C3 | PMMA, SR9008, SR368 | H-Nu 470 (1%), DIDMA (2%) | 0 µm/s | 215 µm/s |
| C4 | PMMA, SR9008, SR368 | H-Nu 470 (1%), DPI PF6 (2%) | 0 µm/s | 77 µm/s |
| C5 | PMMA, SR9008, SR368 | H-Nu 470 (1%), DIDMA (2%), DPI PF6 (2%) | 1240 µm/s | 3440 µm/s |

The results in Table 3 show that when H-Hu 470 was used as the photosensitizer with electron donor compound and/or photoinitiator an order of magnitude higher laser power was required than that required for compositions using photosensitizers with large two-photon absorption cross-sections (Examples 1–7).

Examples 8–11
(Cationic Polymerization of Epoxy)

Rhodamine B (4.2 g) was dissolved in 220 ml water and filtered through infusorial earth. To the filtrate was added, with stirring, 10.0 g sodium hexafluoroantimonate, and the mixture was allowed to stir for about 5 minutes. The resulting mixture with a precipitate was filtered through a frit, and the solid was washed with water and dried overnight in an oven at 80° C., to yield 4.22 g rhodamine B hexafluoroantimonate salt (Rh B SBF6). The structure was confirmed by proton and fluorine NMR.

Epon™ SU-8 (60 g), was mixed with 60 g methylisobutyl ketone, warmed to 50–75° C., and agitated with magnetic stirring until dissolve, resulting in a stock solution. To 25 g of stock solution was added 0.0625 g Rh B SbF6 predissolved in 0.2 ml acetonitrile with mixing by agitation to form masterbatch D. To each of 4 vials was added 5 g masterbatch D. To the first vial was added 0.025 g SR-1012 with mixing by agitation (Example 8). To the second vial was added 0.025 SR-1012 and 0.0275 g TMB with mixing by agitation (Example 9). To the third vial was added 0.025 g DPI SbF6 with mixing by agitation (Example 10). To the fourth vial was added 0.025 g DPI SbF6 and 0.0125 g EDMAB with mixing by agitation (Example 11).

Two milliliters of each of the four resulting solutions prepared above were filtered through a 0.45 µm syringe filter and coated with a spin coater onto silicon wafers (that had been previously treated with TMSPMA) at 3000 RPM for 40 sec, and baked at 80° C. for 40 min to remove solvent.

The coated films were patterned essentially as in Example 1 by a focusing the output of a Spectra-Physics Ti-sapphire laser (100 fs pulses, 80 MHz, 800 nm), using a 10×, 0.25 NA microscope objective, into the film and moving the film mounted on a NEAT LM-600 computer controlled, motorized X-Y stage. Based on gaussian optics formulae, the diameter of the focussed spot is approximately 8 um. The average laser power was measured as the beam exited the objective using an Ophir calibrated photodiode. To assess the photosensitivity of different formulations, a pattern of lines was produced where for each line, the speed of the stage was increased by a factor of $\sqrt{2}$ to cover a range from 77 to 27520 um/s. Following patterning, each sample was subjected to a post-exposure bake at 130° C. for 5 minutes on a hotplate, and the patterns were developed by dipping the patterned films in dimethylformamide for one minute, rinsing in isopropyl alcohol, and air drying. The threshold writing speed was defined as the last line visible in the pattern when examined using an optical microscope.

Table 4 summarizes the threshold writing speeds for Examples 8–11 with three different laser intensities.

TABLE 4

Threshold Writing Speeds for Cationic Polymerization of Epoxy Resin Containing Photosensitizer, Electron Donor Compound and/or Photoinitiator.

| Example Number | Photo-polymer Formulation | Photo-initiator System (% by weight of resin solids) | Threshold Writing Speed (144 mW) | Threshold Writing Speed (337 mW) |
|---|---|---|---|---|
| 8 | SU-8 | RhB SbF6 (0.5%), SR-1012 (1%) | 155 µm/s | NR |
| 9 | SU-8 | RhB SbF6 (0.5%), SR-1012 (1%), TMB (1.1%) | 155 µm/s | NR |
| 10 | SU-8 | RhB SbF6 (0.5%), DPI SbF6 (1%) | NR | 6880 µm/s |
| 11 | SU-8 | RhB SbF6 (0.5%), DPI SbF6 (1%), EDMAB (0.5%) | NR | 1720 µm/s |

NR = not run.

The results in Table 4 show that cationic polymerization occurred in the presence of electron donor compound.

Example 12

Four solutions were made up with the following amounts and compounds under "Safe lights", excluding any ambient light from the solutions.
Solution A
Hydroxy Cyan Leuco Dye, 3 mg
SR-1012, 3 mg
dichloromethane, 3 g
Solution B
Hydroxy Cyan Leuco Dye, 5.5 mg
MPS I, 5.5 mg
dichloromethane, 5.5 g
Solution C
SR-1012, 5 mg
MPS I, 5 mg
dichloromethane, 5 g
Solution D
Hydroxy Cyan Leuco Dye, 5 mg
SR-1012, 5 mg
MPS I, 5 mg
dichloromethane, 5 g.

Each solution A-D was spotted onto a piece of hardened filter paper. The solvent was allowed to evaporate. Each spot on the filter paper was then irradiated by focusing the output of a Spectra-Physics Ti-sapphire laser (100 fs pulses, 80

MHz, 800 nm), using a 10×, 0.25 NA microscope objective, into the spot on the filter paper and moving the filter paper mounted on a NEAT LM-600 computer controlled, motorized X-Y stage in such a way as to expose a square 1 mm by 1 mm in the center of each spot. A laser power of 75 mW was used. Only the spot from solution D developed, resulting in a color change from slight yellow to blue in the 1 mm by 1 mm area exposed to the laser. Thus, the leuco dye was developed through multiphoton absorption using the photoinitiator system made up of the photosensitizer and photoinitiator.

Example 13

A small vial was charged with the following: Hydroxy Cyan Leuco Dye (25 mg), SR-1012 (25 mg), MPS I (25 mg), and dichloromethane (4 g). To this vial was added 4 g of CAB-551-1 (20% solids in dichloropropane) with mixing and exclusion of light. The resulting solution was then spin coated onto a glass slide. After evaporation of the dichloropropane, an area of the resulting coating approximately 2 mm square was exposed essentially as in Example 12. This area, and this area only, developed by a color change from yellow to blue-green.

Example 14

A coating solution is prepared by dissolving in an appropriate solvent (such as MEK) acrylate-based monomers and oligomers (such as trimethylolpropane triacrylate, SR454™, available from Sartomer Co., Inc., Exton, Pa.) and binder (such as poly(methyl methacrylate), available from Aldrich Chemical Co., Milwaukee, Wis.) in a ratio of 60:27.5:12.5. To this solution is added a photoinitiator system, including a multiphoton photosensitizer with large cross-section for multiphoton absorption (such as bis(diphenylamino) stilbene, available from Aldrich Chemical Co.), an 'onium salt (such as diphenyliodonium hexafluorophosphate, described in U.S. Pat. No. 5,545,676, Example 1) and an electron donor such as ethyl dimethylaminobenzoate (available from Aldrich Chemical Co.). The amounts of the components of the photoinitiator system are chosen such that the concentrations of each component as a percentage of solids is about 0.5% multiphoton photosensitizer, 1% 'onium salt, and 1% electron donor. The solution is coated (knife coated, for example) on a substrate (such as a silicon wafer) and the solvent evaporated to yield a coating with dry thickness of about 0.125 mm. Exposure using a focussed, pulsed laser of about 700 nm (such as a Ti-Sapphire laser) in a pattern causes polymerization and insolubilization of the coating, revealed by rinsing the coating with a solvent (such as MEK) and removing the unexposed coating.

Example 15

A coating solution is prepared by dissolving in an appropriate solvent (such as MEK) an epoxy-functional monomer (such as ERL 4221™, a cycloaliphatic epoxy compound available from union Carbide Co., Danbury, Conn.) and binder (such as poly(methyl methacrylate)) in a ratio of 60:27.5:12.5. To this solution is added a photoinitiator system, including a multiphoton photosensitizer with large cross-section for multiphoton absorption (such as bis (diphenylamino)stilbene), an 'onium salt such as diphenyliodonium hexafluoroantimonate, and an electron donor such as ethyl dimethylaminobenzoate. The amounts of the components of the photoinitiator system are chosen such that the concentrations of each component as a percentage of solids is about 0.5% multiphoton photosensitizer, 1% 'onium salt, and 0.5% electron donor. The solution is coated (knife coated, for example) on a substrate (such as a silicon wafer) and the solvent evaporated to yield a coating with dry thickness of about 0.125 mm. Exposure using a focussed, pulsed laser of about 700 nm (such as a Ti-Sapphire laser) in a pattern causes polymerization and insolubilization of the coating, revealed by rinsing the coating with a solvent (such as MEK) and removing the unexposed coating.

Example 16

MPS I (16.7 mg) and DPI $PF_6$ (60 mg) were dissolved in 1 ml dioxane. The resulting solution was then added to 24.0 g of tetrahydropyranyl methacrylate (THP-MA) solution (14% solid in 1-methoxy-2-propanol) to form a two-component solution. A film (~100 μm thick) of the two-component solution was cast on a glass slide and baked at 90° C. for 15 minutes on a hot plate. The resulting sample was placed horizontally on a movable stage. A Ti:Sapphire laser (part of a Hurricane™ system manufactured by Spectra-Physics, Inc.; 800 nm, 100 fs pulses, 80 mHz) was used for exposure of the film. The power used was 17 mW, and the objective lens used was a 10× (N.A. 0.25). The laser beam was focused toward the film-glass slide interface. The stage moved over a range of speeds (started with 28 and ended with 5120 μm/sec) as the film was exposed. After a post-exposure bake (PEB) at 90° C. for 5 minutes on a hot plate, the film was developed with 2% $Na_2CO_3$ solution for 5 minutes. Lines with writing speed of 28, 40, 56, and 80 μm/sec were observed.

Example 17

5.0 mg of trimethoxybenzene is added to 10 g of the two-component solution of Example 16 to provide a three-component solution. A film of the three-component solution is cast, baked, and exposed in the same manner as in Example 16. After development in 2% $Na_2CO_3$ solution for 5 minutes, lines with writing speeds of 28, 40, 56, and 80 μm/sec are observed.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. A method of multiphoton photosensitizing comprising
   (a) preparing a photoreactive composition comprising
      (1) at least one reactive species that is capable of undergoing an acid- or radical-initiated chemical reaction; and
      (2) at least one multiphoton photoinitiator system comprising photochemically effective amounts of
         (i) at least one multiphoton photosensitizer that is capable of simultaneously absorbing at least two photons and that has a two-photon absorption cross-section greater than that of fluorescein;
         (ii) optionally, at least one electron donor compound different from said multiphoton photosensitizer and capable of donating an electron to an electronic excited state of said photosensitizer; and (iii) at least one photoinitiator that is capable of being photosensitized by accepting an electron from an electronic excited state of said photosensitizer, resulting in the formation of at least one free radical and/or acid; and (b) irradiating said composition with light sufficient to cause simultaneous absorption of at least two photons, thereby inducing at least one acid- or radical-initiated chemical reaction where said composition is exposed to the light;

with the proviso that said multiphoton photoinitiator system comprises at least one electron donor compound whenever said photoreactive composition comprises at least one said reactive species that is capable of undergoing an acid-initiated chemical reaction and that is either a curable species or a non-curable, reactive polymer.

2. The method of claim 1 wherein said reactive species is a curable species.

3. The method of claim 2 wherein said curable species is selected from the group consisting of monomers, oligomers, reactive polymers, and mixtures thereof.

4. The method of claim 3 wherein said curable species is selected from the group consisting of addition-polymerizable monomers and oligomers, addition-crosslinkable polymers, cationically-polymerizable monomers and oligomers, cationically-crosslinkable polymers, and mixtures thereof.

5. The method of claim 1 wherein said reactive species is a non-curable species.

6. The method of claim 1 wherein said multiphoton photosensitizer has a two-photon absorption cross-section greater than about $50 \times 10^{-50}$ cm$^4$ sec/photon.

7. The method of claim 1 wherein said multiphoton photosensitizer has a two-photon absorption cross-section greater than about 1.5 times that of fluorescein.

8. The method of claim 1 wherein said multiphoton photosensitizer has a two-photon absorption cross-section greater than about $75 \times 10^{-50}$ cm$^4$ sec/photon.

9. The method of claim 1 wherein said multiphoton photosensitizer has a two-photon absorption cross-section greater than about 2 times that of fluorescein.

10. The method of claim 1 wherein said multiphoton photosensitizer has a two-photon absorption cross-section greater than about $100 \times 10^{-50}$ cm$^4$ sec/photon.

11. The method of claim 1 wherein said multiphoton photosensitizer has a two-photon absorption cross-section greater than about 3 times that of fluorescein.

12. The method of claim 1 wherein said multiphoton photosensitizer has a two-photon absorption cross-section greater than about $150 \times 10^{-50}$ cm$^4$ sec/photon.

13. The method of claim 1 wherein said multiphoton photosensitizer has a two-photon absorption cross-section greater than about 4 times that of fluorescein.

14. The method of claim 1 wherein said multiphoton photosensitizer has a two-photon absorption cross-section greater than about $200 \times 10^{-50}$ cm$^4$ sec/photon.

15. The method of claim 1 wherein said multiphoton photosensitizer is Rhodamine B.

16. The method of claim 1 wherein said multiphoton photosensitizer is selected from the following compounds:

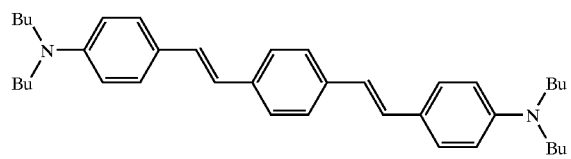

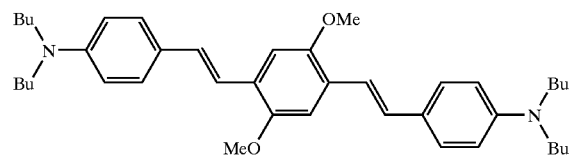

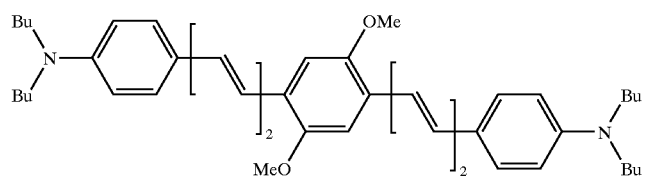

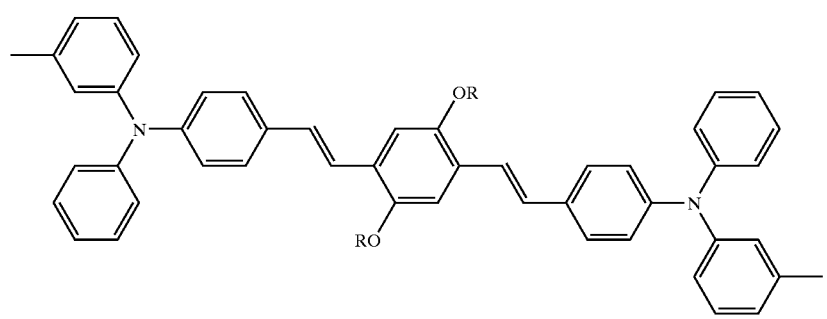

R = C$_{12}$H$_{25}$

-continued
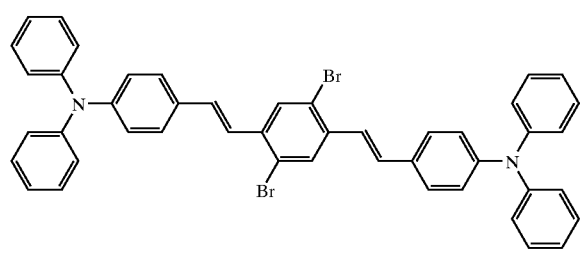
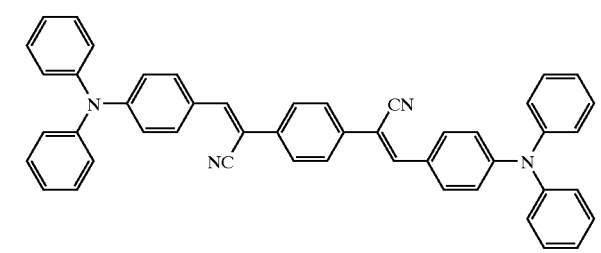
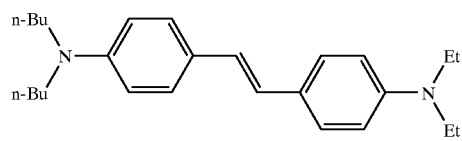
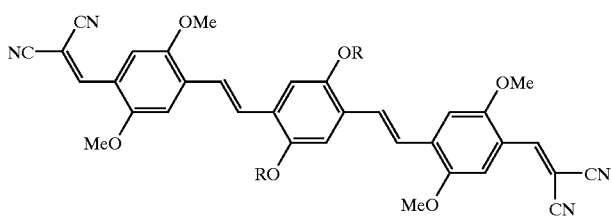
R = C₁₂H₂₅
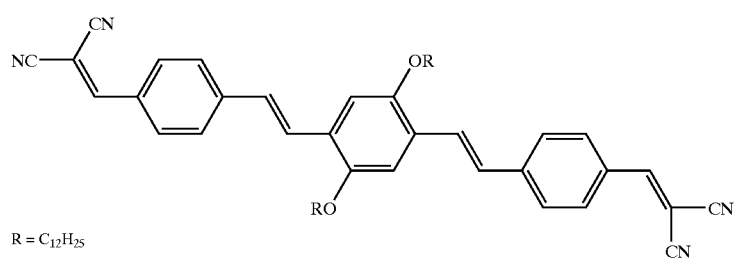
R = C₁₂H₂₅
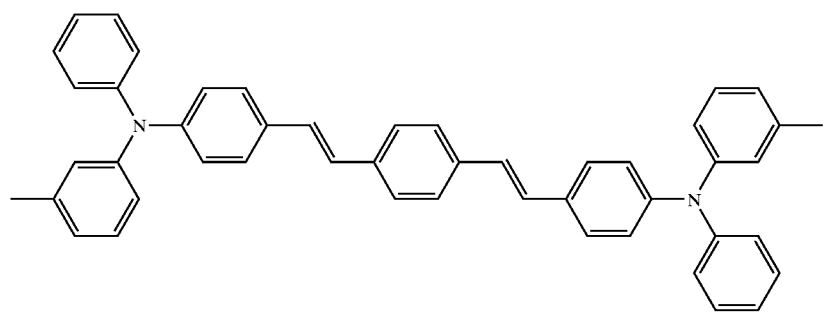
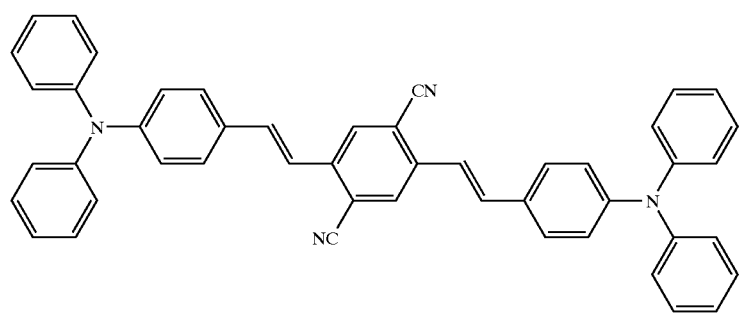
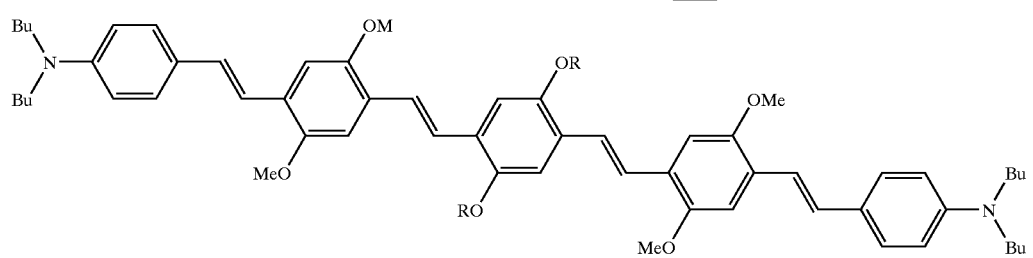
R = C₁₂H₂₅

-continued
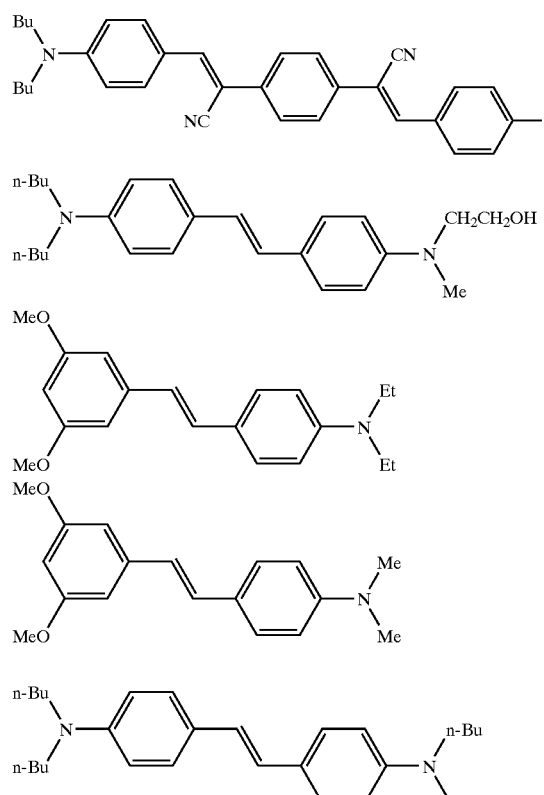
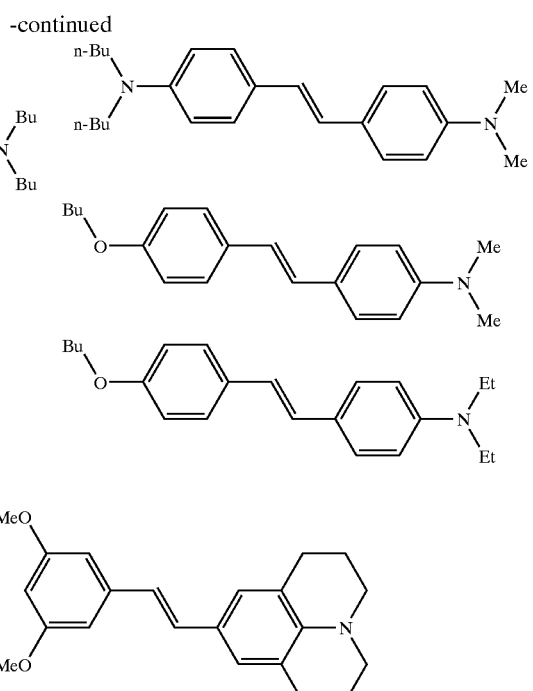
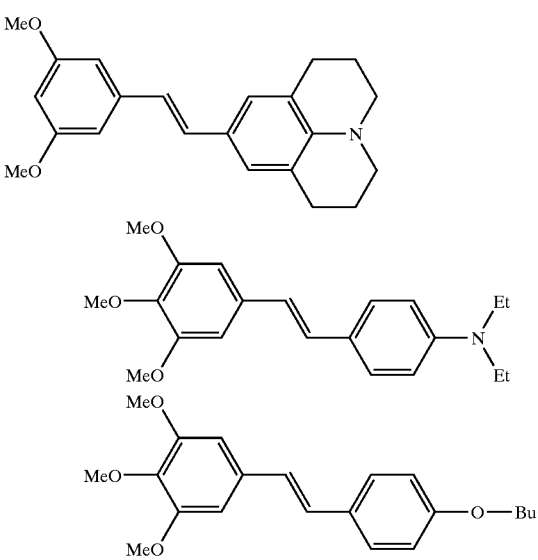
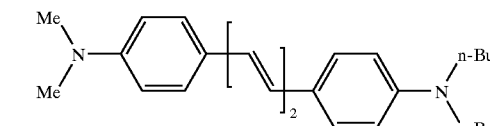
where X⁻ = Cl⁻, PF$_6$⁻, SbF$_6$⁻, AsF$_6$⁻, BF$_4$⁻, CF$_3$SO$_3$⁻
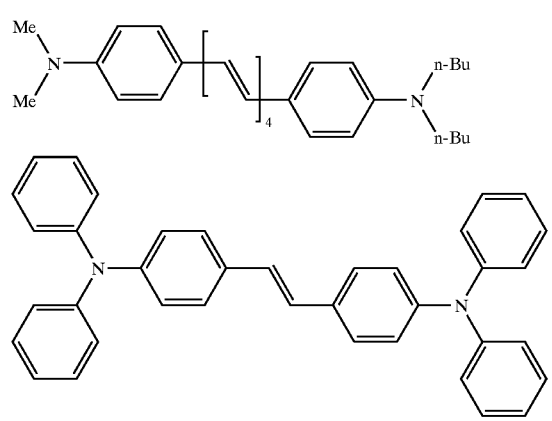
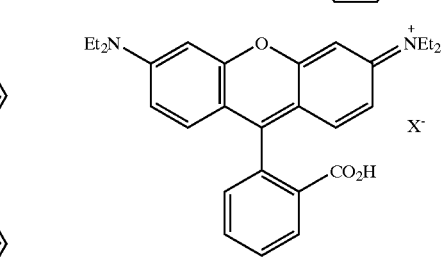
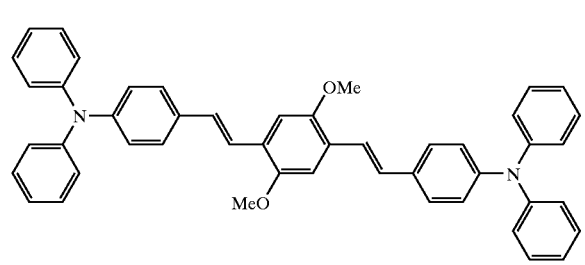
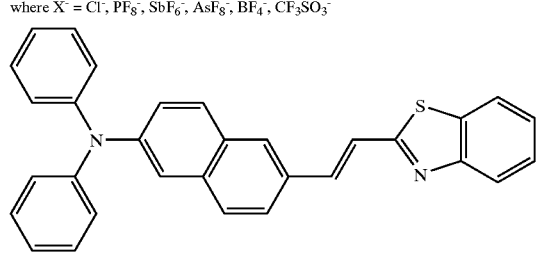

-continued
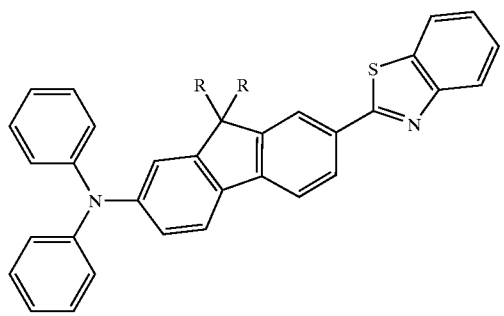
R = R = C2H5, C10H21, C18H37
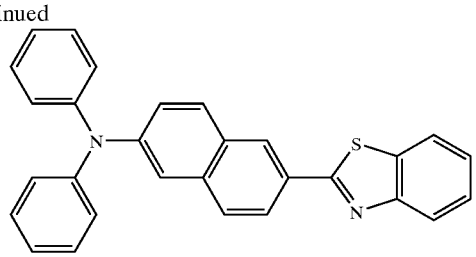
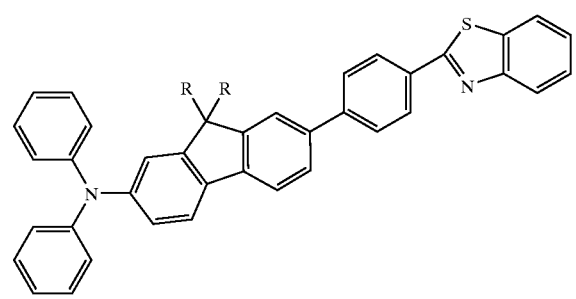
R = C2H5
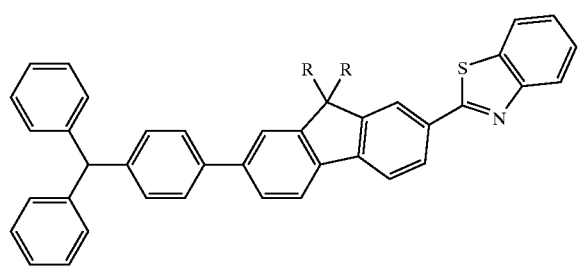
R = C2H5
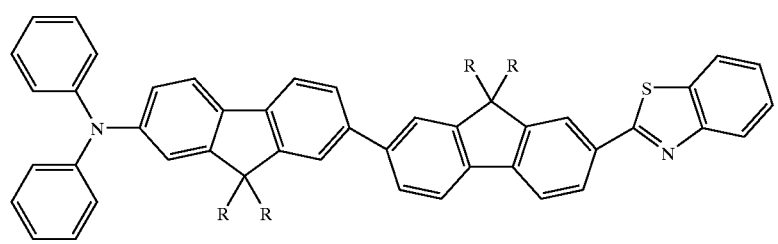
R = C2H5
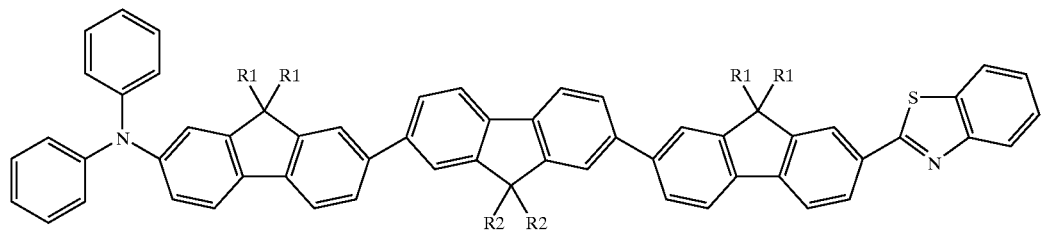
R1 = C2H5
R2 = C10H21
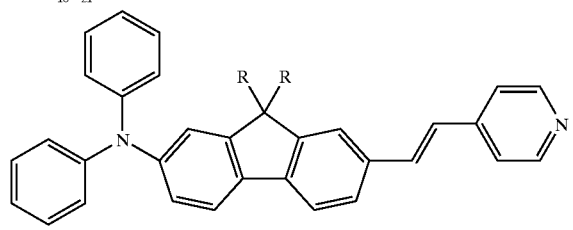
R = C10H21
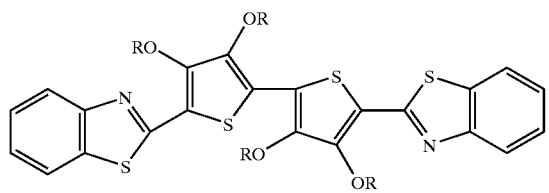
R = C10H21

17. The method of claim 1 wherein said electron donor compound has an oxidation potential that is greater than zero and less than or equal to that of p-dimethoxybenzene.

18. The method of claim 1 wherein said electron donor compound has an oxidation potential between about 0.3 and 1 volt vs. a standard saturated calomel electrode.

19. The method of claim 1 wherein said electron donor compound is selected from the group consisting of amines, amides, ethers, ureas, sulfinic acids and their salts, salts of ferrocyanide, ascorbic acid and its salts, dithiocarbamic acid and its salts, salts of xanthates, salts of ethylene diamine tetraacetic acid, salts of $(alkyl)_n(aryl)_m$ borates (n+m =4), $SnR_4$ compounds (where each R is independently chosen from the group consisting of alkyl, aralkyl, aryl, and alkaryl groups), ferrocene, and mixtures thereof.

20. The method of claim 19 wherein said electron donor compound is selected from the group consisting of amines that contain one or more julolidinyl moieties, alkylarylborate salts, salts of aromatic sulfinic acids, 4-dimethylaminobenzoic acid, ethyl 4dimethylaminobenzoate, 3-dimethylaminobenzoic acid, 4-dimethylaminobenzoin, 4-dimethylaminobenzaldehyde, 4-dimethylaminobenzonitrile, 4-dimethylaminophenethyl alcohol, 1,2,4-trimethoxybenzene, and mixtures thereof.

21. The method of claim 1 wherein said photoreactive composition contains no electron donor compound.

22. The method of claim 1 wherein said photoinitiator is selected from the group consisting of iodonium salts, sulfonium salts, diazonium salts, azinium salts, chloromethylated triazines, triarylimidazolyl dimers, and mixtures thereof.

23. The method of claim 22 wherein said photoinitiator is selected from the group consisting of iodonium salts, chloromethylated triazines, triarylimidazolyl dimers, sulfonium salts, diazonium salts, and mixtures thereof.

24. The method of claim 23 wherein said photoinitiator is selected from the group consisting of aryliodonium salts, chloromethylated triazines, 2,4,5-triphenylimidazolyl dimers, and mixtures thereof.

25. The method of claim 1 wherein said photoreactive composition comprises from about 5% to about 99.79% by weight of said at least one reactive species, from about 0.01% to about 10% by weight of said at least one multiphoton photosensitizer, up to about 10% by weight of said at least one electron donor compound, and from about 0.1% to about 10% by weight of said at least one photoinitiator, based upon the total weight of solids.

26. The method of claim 1 wherein said photoreactive composition further comprises at least one adjuvant selected from the group consisting of solvents, diluents, resins, binders, plasticizers, pigments, dyes, inorganic or organic reinforcing or extending fillers, thixotropic agents, indicators, inhibitors, stabilizers, ultraviolet absorbers, and medicaments.

27. The method of claim 1 wherein said irradiating is pulse irradiating.

28. The method of claim 27 wherein said pulse irradiating is carried out using a near infrared pulsed laser having a pulse length less than about $10^{-8}$ second.

29. The method of claim 1 wherein said method provides linear imaging speeds of about 5 to about 100,000 microns/second using a laser pulse duration of about $10^{-8}$ to $10^{-15}$ second and about $10^2$ to $10^9$ pulses per second.

30. A method of multiphoton photosensitizing comprising
(a) preparing a photoreactive composition comprising
(1) at least one curable species that is capable of undergoing a radical-initiated chemical reaction; and
(2) at least one multiphoton photoinitiator system comprising photochemically effective amounts of
(i) Rhodamine B;
(ii) optionally, at least one alkylarylborate salt; and
(iii) at least one iodonium salt; and
(b) irradiating said composition with light sufficient to cause simultaneous absorption of at least two photons, thereby inducing at least one radical-initiated chemical reaction where said composition is exposed to the light.

31. A method of multiphoton photosensitizing, the method comprising pulse irradiating a multiphoton-curable composition with light sufficient to cause simultaneous absorption of at least two photons, thereby curing the multiphoton-curable composition where exposed to the light, wherein the multiphoton-curable composition comprises:
at least one curable species selected from the group consisting of monomers, oligomers, and reactive polymers;
a multiphoton photoinitiator system comprising photochemically effective amounts of:
at least one multiphoton photosensitizer capable of simultaneously absorbing at least two photons and having a two-photon absorption cross-section of greater than about $50 \times 10^{-50}$ cm$^4$ sec/photon; and
at least one electron donor compound different from the multiphoton photosensitizer, wherein the oxidation potential of the electron donor is greater than zero and less than or equal to that of p-dimethoxybenzene; and
at least one photoinitiator selected from the group consisting of aryliodonium salts, chloromethylated triazines, and 2,4,5-triphenylimidazolyl dimers.

32. The method of claim 31 wherein the multiphoton photosensitizer is capable of photosensitizing 2-methyl-4,6-bis(trichloromethyl)-s-triazine when exposed in the wavelength range of the single-photon absorption spectrum of the photosensitizer under conditions wherein no measurable multiphoton absorption occurs.

33. The method of claim 31 wherein the multiphoton photosensitizer has a two-photon absorption cross-section of greater than about $100 \times 10^{-50}$ cm$^4$ sec/photon.

34. The method of claim 31 wherein the multiphoton photosensitizer has a two-photon absorption cross-section of greater than about $150 \times 10^{-50}$ cm$^4$ sec/photon.

35. The method of claim 31 wherein the multiphoton photosensitizer has a two-photon absorption cross-section of greater than about $200 \times 10^{-50}$ cm$^4$ sec/photon.

* * * * *

UNITED STATES PATENT AND TRADEMARK OFFICE
CERTIFICATE OF CORRECTION

PATENT NO. : 6,852,766 B1
APPLICATION NO. : 10/311041
DATED : February 8, 2005
INVENTOR(S) : Devoe, Robert J.

It is certified that error appears in the above-identified patent and that said Letters Patent is hereby corrected as shown below:

On The Title Page
Page 2 Col. 1 (Other Publications) – Line 40 - Delete "intiators" and insert - - initiators - -, therefor.

Page 2 Col. 1 (Other Publications) – Line 48 - After "Mater" delete "," and insert - - . - -, therefor.

Page 2 Col. 1 (Other Publications) – Line 57 - After "SPIE" delete ",".

Page 2 Col. 2 (Other Publications) – Line 53 - Delete "Dvomikov" and insert - - Dvornikov - -, therefor.

Page 2 Col. 2 (Other Publications) – Line 61 - Delete "by" and insert - - By - -, therefor.

Page 3 Col. 1 (Other Publications) – Line 20 - After "March" insert - - , - -.

Page 3 Col. 1 (Other Publications) – Line 23 - After "March" insert - - , - -.

Page 3 Col. 1 (Other Publications) – Line 26 - After "March" insert - - , - -.

Signed and Sealed this

Twenty-second Day of August, 2006

JON W. DUDAS
*Director of the United States Patent and Trademark Office*